(12) United States Patent
Cheng et al.

(10) Patent No.: US 10,770,562 B1
(45) Date of Patent: Sep. 8, 2020

(54) INTERLAYER DIELECTRIC REPLACEMENT TECHNIQUES WITH PROTECTION FOR SOURCE/DRAIN CONTACTS

(71) Applicant: International Business Machines Corporation, Armonk, NY (US)

(72) Inventors: Kangguo Cheng, Schenectady, NY (US); Juntao Li, Cohoes, NY (US); Andrew Greene, Albany, NY (US); Vimal Kamineni, Mechanicville, NY (US); Adra Carr, Albany, NY (US); Chanro Park, Clifton Park, NY (US); Ruilong Xie, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/290,182

(22) Filed: Mar. 1, 2019

(51) Int. Cl.
*H01L 21/00* (2006.01)
*H01L 29/45* (2006.01)
(Continued)

(52) U.S. Cl.
CPC ...... *H01L 29/456* (2013.01); *H01L 21/02164* (2013.01); *H01L 21/02532* (2013.01); *H01L 21/02592* (2013.01); *H01L 21/31053* (2013.01); *H01L 21/31116* (2013.01); *H01L 21/3212* (2013.01); *H01L 21/32053* (2013.01); *H01L 21/76889* (2013.01); *H01L 29/41791* (2013.01); *H01L 29/66795* (2013.01); *H01L 29/7851* (2013.01); *H01L 21/0228* (2013.01); *H01L 21/02274* (2013.01); *H01L 21/02631* (2013.01); *H01L 21/76224* (2013.01); *H01L 21/76802* (2013.01); *H01L 21/76877* (2013.01); *H01L 21/823418* (2013.01);
(Continued)

(58) Field of Classification Search
CPC ............... H01L 29/456; H01L 21/3212; H01L 21/02532
See application file for complete search history.

(56) References Cited

U.S. PATENT DOCUMENTS 5,814,530 A * 9/1998 Tsai .................. H01L 27/14603
257/E27.131
5,880,018 A 3/1999 Boeck et al.
(Continued)

*Primary Examiner* — Laura M Menz
(74) *Attorney, Agent, or Firm* — Vazken Alexanian; Ryan, Mason & Lewis, LLP

(57) ABSTRACT

Techniques are provided for fabricating a semiconductor integrated circuit device which implement an interlayer dielectric (ILD) layer replacement process to replace an initial sacrificial ILD layer with a low-k ILD layer, while forming silicide or dielectric capping layers to protect source/drain contacts of field-effect transistor devices from etch damage during the ILD replacement process. For example, source/drain contact openings (e.g., trenches) are formed in a sacrificial ILD layer and metallic source/drain contacts are formed in the source/drain contact openings. Protective capping layers (e.g., metal-semiconductor alloy capping layers or dielectric capping layers) are formed on upper surfaces of the metallic source/drain contacts. The sacrificial ILD layer is removed using an etch process to etch down the sacrificial ILD layer selective to the protective capping layers, and a low-k ILD layer is formed in place of the removed sacrificial ILD layer.

12 Claims, 20 Drawing Sheets

(51) Int. Cl.
*H01L 21/768* (2006.01)
*H01L 21/311* (2006.01)
*H01L 21/02* (2006.01)
*H01L 21/3205* (2006.01)
*H01L 21/3105* (2006.01)
*H01L 21/321* (2006.01)
*H01L 29/78* (2006.01)
*H01L 29/66* (2006.01)
*H01L 29/417* (2006.01)
*H01L 21/8234* (2006.01)
*H01L 21/762* (2006.01)

(52) U.S. Cl.
CPC ........... *H01L 21/823431* (2013.01); *H01L 21/823437* (2013.01); *H01L 21/823481* (2013.01); *H01L 29/6656* (2013.01); *H01L 29/66545* (2013.01)

(56) References Cited

U.S. PATENT DOCUMENTS

| | | | |
|---|---|---|---|
| 6,294,448 B1 * | 9/2001 | Chang | H01L 21/28518 257/E21.165 |
| 6,335,249 B1 * | 1/2002 | Thei | H01L 21/28518 257/E21.165 |
| 6,423,628 B1 | 7/2002 | Li et al. | |
| 7,473,984 B2 | 1/2009 | Lee | |
| 7,585,716 B2 | 9/2009 | Cheng | |
| 7,838,373 B2 | 11/2010 | Giles et al. | |
| 8,466,056 B2 | 6/2013 | Agarwala et al. | |
| 8,624,329 B2 | 1/2014 | Lee et al. | |
| 9,129,987 B2 | 9/2015 | Wan et al. | |
| 9,466,565 B2 | 10/2016 | Bohr et al. | |
| 9,728,466 B1 * | 8/2017 | Mallela | H01L 21/823814 |
| 9,773,913 B1 * | 9/2017 | Balakrishnan | H01L 29/78618 |
| 10,186,456 B2 * | 1/2019 | Wang | H01L 21/76895 |
| 10,276,434 B1 * | 4/2019 | Chen | H01L 21/76885 |
| 10,559,685 B2 * | 2/2020 | Li | H01L 21/76889 |
| 2005/0272248 A1 | 12/2005 | Kloster et al. | |
| 2006/0105510 A1 * | 5/2006 | Mun | H01L 29/66462 438/172 |
| 2007/0249131 A1 * | 10/2007 | Allen | H01L 21/28088 438/301 |
| 2009/0017586 A1 * | 1/2009 | Fang | H01L 21/823807 438/199 |
| 2014/0154856 A1 * | 6/2014 | Alptekin | H01L 29/7845 438/299 |
| 2015/0255277 A1 * | 9/2015 | Tong | H01L 21/324 257/288 |
| 2015/0279726 A1 * | 10/2015 | Ren | H01L 21/31116 438/618 |
| 2015/0280002 A1 * | 10/2015 | Lu | H01L 29/66969 257/43 |
| 2018/0069124 A1 | 3/2018 | Cheng et al. | |
| 2018/0076040 A1 * | 3/2018 | Ando | H01L 29/513 |
| 2018/0308751 A1 * | 10/2018 | Wang | H01L 21/76831 |
| 2019/0051666 A1 * | 2/2019 | Li | H01L 27/1203 |
| 2019/0386135 A1 * | 12/2019 | Li | H01L 29/456 |
| 2020/0020567 A1 * | 1/2020 | Sun | H01L 29/785 |
| 2020/0119191 A1 * | 4/2020 | Li | H01L 21/823814 |

* cited by examiner

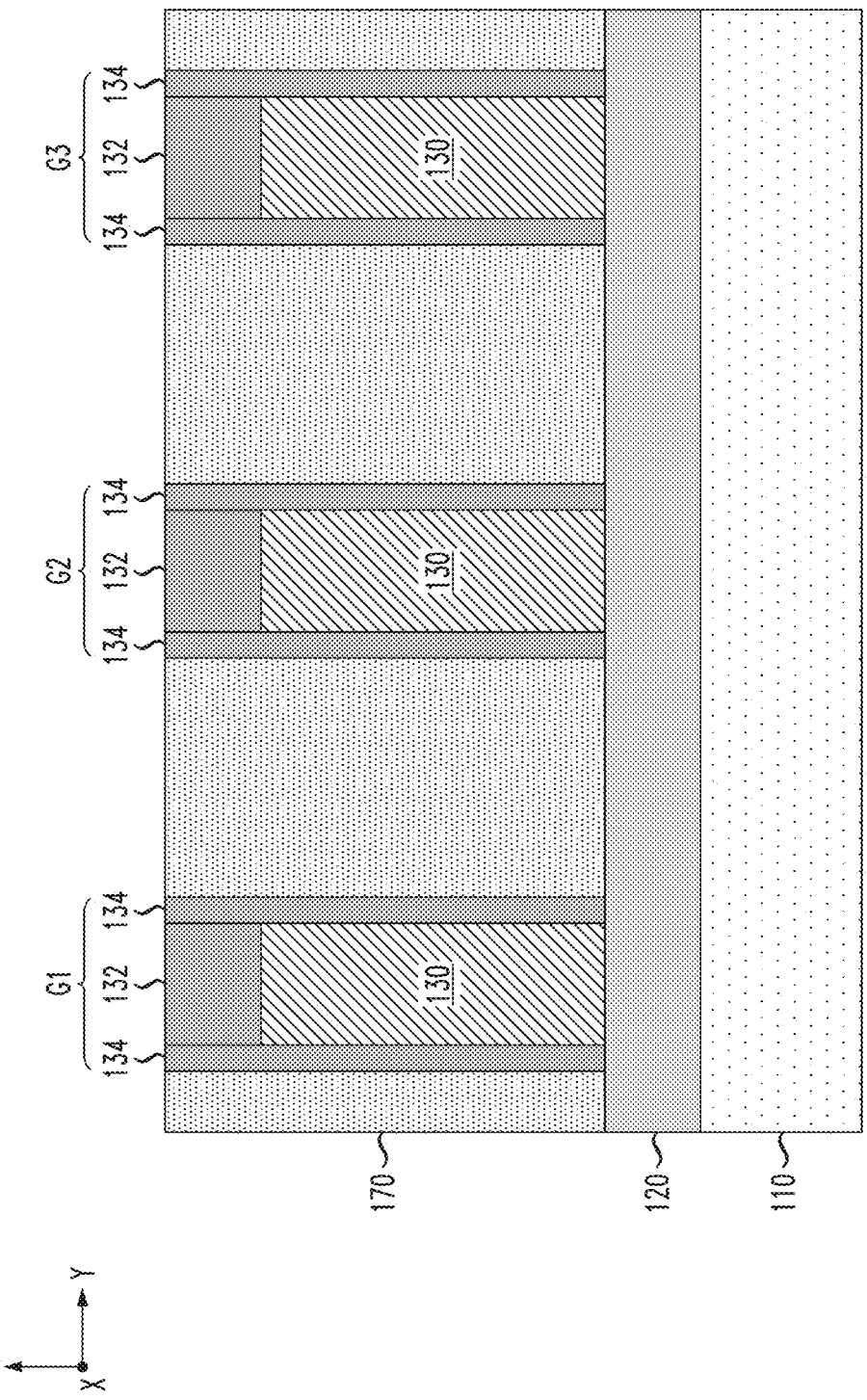

100

100

US 10,770,562 B1

INTERLAYER DIELECTRIC REPLACEMENT TECHNIQUES WITH PROTECTION FOR SOURCE/DRAIN CONTACTS

TECHNICAL FIELD

This disclosure generally relates to semiconductor fabrication techniques and, in particular, middle-of the-line fabrication techniques for FET (field effect transistor) devices.

BACKGROUND

Continued innovations in semiconductor process technologies are enabling higher integration densities and device scaling. As semiconductor manufacturing technologies continue to evolve toward smaller design rules and higher integration densities (e.g., 14 nm technology node and beyond), integrated circuit devices and components become increasingly smaller, creating challenges in layout formation and device optimization. Currently, FinFET technologies are typically implemented for FET fabrication, as such technologies provide effective CMOS scaling solutions for FET fabrication at, and below, the 14 nm technology node. A FinFET device comprises a three-dimensional fin-shaped FET structure which includes at least one vertical semiconductor fin structure formed on a substrate, a gate structure formed over a portion of the vertical semiconductor fin, and source/drain regions formed from portions of the vertical semiconductor fin which extend from both sides of the gate structure. The portion of the vertical semiconductor fin that is covered by the gate structure between the source/drain regions comprises a channel region of the FinFET device.

While technological improvements in source/drain contact fabrication techniques have provided a dramatic reduction in the resistance of FET devices, techniques for reducing the parasitic capacitance between active FET devices have become more crucial for improving device performance and reducing power consumption. In general, a reduction in the parasitic capacitance between active devices can be achieved by utilizing a low-k dielectric material to form an initial interlayer dielectric (ILD) layer at the contact/transistor level, which encapsulates the source/drain contacts and metal gate structures. However, the low-k dielectric material that forms the initial ILD layer can become damaged and contaminated as a result of the various fabrication processes (e.g., reactive ion etching, thermal annealing, chemical mechanical polishing, etc.) that are utilized to form source/drain contacts (e.g., trench silicide contacts) and metal gates (e.g., replacement metal gate process), etc., wherein such damage and contamination leads to an undesirable increase in the effective dielectric constant of the initial low-k ILD layer.

SUMMARY

Embodiments of the invention include device and methods for fabricating a semiconductor integrated circuit (IC) device, which implement an ILD replacement process to replace an initial sacrificial ILD layer with a low-k ILD layer, while forming silicide or dielectric capping layers to protect source/drain contacts from etch damage during the ILD replacement process.

For example, in one embodiment, a method for fabricating a semiconductor integrated circuit (IC) device comprises: forming a field-effect transistor device on a semiconductor substrate, wherein the field-effect transistor device comprise a gate structure and source/drain layers; forming a sacrificial interlayer dielectric layer to encapsulate the field-effect transistor device; performing a metallization process to form metallic source/drain contacts in the sacrificial interlayer dielectric layer in contact with source/drain layers of the field-effect transistor device; depositing a semiconductor layer on the sacrificial interlayer dielectric layer and the metallic source/drain contacts; performing a thermal anneal process to induce a reaction between the semiconductor layer and the metallic source-drain contacts to form metal-semiconductor alloy capping layers in upper surface regions of the metallic source/drain contacts; removing unreacted portions of the semiconductor layer remaining after the thermal anneal process; performing an etch process to remove the sacrificial interlayer dielectric layer, wherein the etch process is selective to the metal-semiconductor alloy capping layers such that the metal-semiconductor alloy capping layers protect the metallic source/drain contacts from etch damage during the etch process; and forming a low-k interlayer dielectric layer in place of the removed sacrificial interlayer dielectric layer.

In another embodiment, a method for fabricating a semiconductor IC device comprises: forming a field-effect transistor device on a semiconductor substrate, wherein the field-effect transistor device comprises a gate structure and source/drain layers; forming a sacrificial interlayer dielectric layer to encapsulate the field-effect transistor device, wherein an upper surface of the sacrificial interlayer dielectric layer is disposed above an upper surface of the gate structure of the field-effect transistor device; performing a metallization process to form metallic source/drain contacts in the sacrificial interlayer dielectric layer in contact with the source/drain layers of the field-effect transistor device; performing a metal recess process to recess exposed surfaces of the metallic source/drain contacts to a target level below an upper surface of the sacrificial interlayer dielectric layer; forming dielectric capping layers on the recessed surfaces of the metallic source/drain contacts; performing an etch process to remove the sacrificial interlayer dielectric layer, wherein the etch process is selective to the dielectric capping layers such that the dielectric capping layers protect the metallic source/drain contacts from etch damage during the etch process; and forming a low-k interlayer dielectric layer in place of the removed sacrificial interlayer dielectric layer.

Another embodiment includes a semiconductor integrated circuit device which comprises: a field-effect transistor device disposed on a semiconductor substrate, wherein the field-effect transistor device comprises a gate structure and first and second source/drain layers; a low-k interlayer dielectric layer encapsulating the field-effect transistor device; first and second metallic source/drain contacts disposed in the low-k interlayer dielectric layer in contact with the first and second source/drain layers, respectively, of the field-effect transistor device; and first and second metal-semiconductor alloy capping layers disposed in upper surface regions of the first and second metallic source/drain contacts, respectively. In some embodiments, the first and second metal-semiconductor alloy capping layers comprise a cobalt-silicon alloy or a ruthenium-silicon alloy, and the low-k interlayer dielectric layer comprises dielectric material having a dielectric constant k of about 3.0 or less.

Other embodiments will be described in the following detailed description of embodiments, which is to be read in conjunction with the accompanying figures.

BRIEF DESCRIPTION OF THE DRAWINGS

FIGS. 1A, 1B, 1C, and 1D are schematic views of a semiconductor IC device at an intermediate stage of fabrication after performing an interlayer dielectric layer replacement process to replace a sacrificial ILD layer with a low-k ILD dielectric layer, according to an embodiment of the invention, wherein:

FIG. 1A is a schematic cross-sectional side view of the semiconductor IC device along line 1A-1A shown in FIG. 1D;

FIG. 1B is a schematic cross-sectional side view of the semiconductor IC device along line 1B-1B shown in FIG. 1D;

FIG. 1C is a schematic cross-sectional side view of the semiconductor IC device along line 1C-1C shown in FIG. 1D; and FIG. 1D is a schematic top plan view of the semiconductor IC device shown in FIGS. 1A, 1B and 1C.

FIGS. 2A through 7 schematically illustrate a process for fabricating a semiconductor IC device in which an interlayer dielectric layer replacement process is implemented to replace an initial sacrificial ILD layer with a low-k ILD layer, according to an embodiment of the invention, wherein:

FIG. 2A is a schematic cross-sectional side view of the semiconductor IC device at an intermediate stage of fabrication in which FinFET devices with source/drain layers and metal gate structures are formed on a semiconductor substrate and encapsulated in sacrificial ILD layers;

FIG. 5 is a schematic cross-sectional side view of the semiconductor IC device of FIG. 4A after performing a thermal anneal process to induce a reaction between the semiconductor material of the semiconductor layer and metallic material in an upper surface region of the contact metallization to form metal-semiconductor alloy capping layers;

FIG. 7 is a schematic cross-sectional side view of the semiconductor IC device of FIG. 6A after depositing a layer of low-k dielectric material to replace the sacrificial ILD layers with a low-k ILD layer.

FIGS. 8 through 10 schematically illustrate a process for fabricating a semiconductor IC device in which an interlayer dielectric layer replacement process is implemented to replace an initial sacrificial ILD layer with a low-k ILD layer, according to another embodiment of the invention, wherein:

FIG. 8 is a schematic cross-sectional side view of the semiconductor IC device at an intermediate stage of fabrication wherein FinFET devices with source/drain layers and metal gate structures are formed on a semiconductor substrate and encapsulated in sacrificial ILD layers, and wherein source/drain contact metallization is formed within source/drain contact openings etched in the sacrificial ILD layers;

FIG. 9 is a schematic cross-sectional side view of the semiconductor IC device of FIG. 8 after forming a protective dielectric capping layer on the contact metallization; and FIG. 10 is a schematic cross-sectional side view of the semiconductor IC device of FIG. 9 after performing an etch back process to remove the sacrificial ILD layers and after depositing a layer of low-k dielectric material to replace the sacrificial ILD layers with a low-k ILD layer.

FIGS. 11 through 13 schematically illustrate a process for fabricating a semiconductor IC device in which an interlayer dielectric layer replacement process is implemented to replace an initial sacrificial ILD with a low-k ILD dielectric layer, according to another embodiment of the invention, wherein:

FIG. 11 is a schematic cross-sectional side view of the semiconductor IC device at an intermediate stage of fabrication wherein FinFET devices with source/drain layers and metal gate structures are formed on a semiconductor substrate and encapsulated in a sacrificial ILD layer, and after forming an etch mask and patterning the sacrificial ILD layer using the etch mask to form discrete source/drain contact openings to expose the source/drain layers;

FIG. 12 is a schematic cross-sectional side view of the semiconductor IC device shown in FIG. 11 after stripping away a remaining portion of the etch mask, performing a source/drain contact metallization process to fill the source/drain contact openings with metallization to form discrete metallic source/drain contacts, forming a semiconductor layer over the sacrificial ILD layer and the discrete metallic source/drain contacts, and after performing a thermal anneal process to induce a reaction between semiconductor material of the semiconductor layer and metallic material in upper surface regions of the discrete metallic source/drain contacts to form metal-semiconductor alloy capping layers; and FIG. 13 is a schematic cross-sectional side view of the semiconductor IC device of FIG. 12 after stripping away unreacted portions of the semiconductor layer which remain following the thermal anneal process, removing the sacrificial ILD layer, and after depositing a layer of low-k dielectric material to form a low-k ILD layer.

DETAILED DESCRIPTION

Figure 1A:
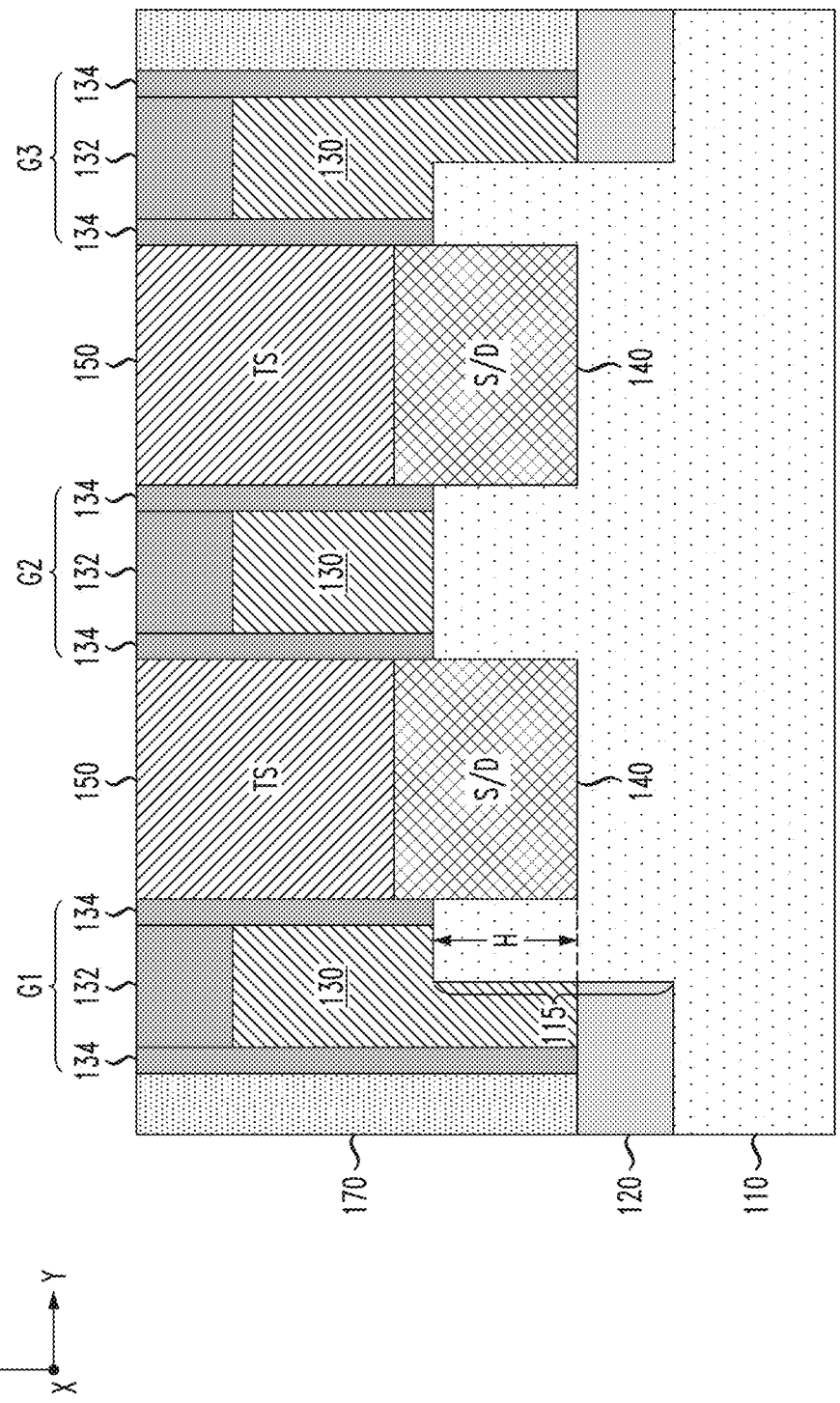

Embodiments of the invention will now be described in further detail with regard devices and methods for fabricating a semiconductor IC device, which implement an ILD replacement process to replace an initial sacrificial ILD layer with a low-k ILD layer, while forming silicide or dielectric capping layers to protect source/drain contacts from etch damage during the ILD replacement process. It is to be understood that the various layers, structures, and regions shown in the accompanying drawings are schematic illustrations that are not drawn to scale. In addition, for ease of explanation, one or more layers, structures, and regions of a type commonly used to form semiconductor IC devices or structures may not be explicitly shown in a given drawing. This does not imply that any layers, structures, and regions not explicitly shown are omitted from the actual semiconductor IC device structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor IC devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

To provide spatial context to the different structural orientations of the semiconductor IC device structures shown throughout the drawings, XYZ Cartesian coordinates are shown in each of the drawings. The terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or a Y-direction of the Cartesian coordinates shown in the drawings.

Figure 1B:
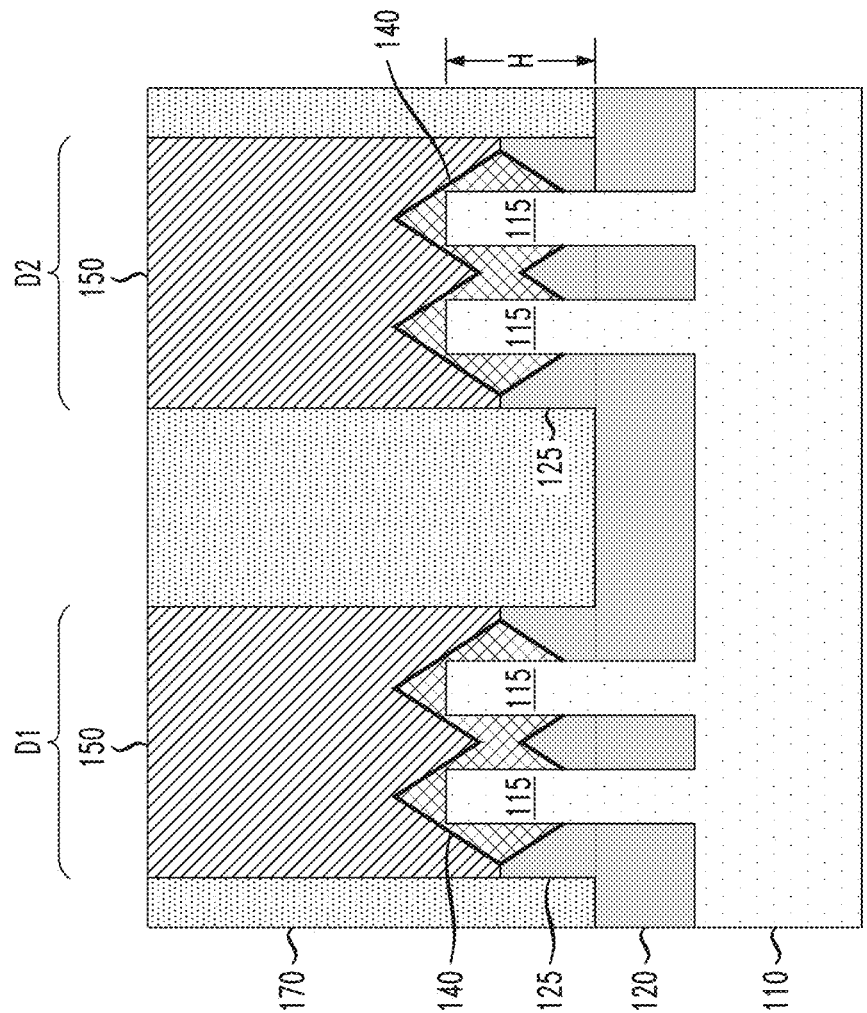
Figure 1D:
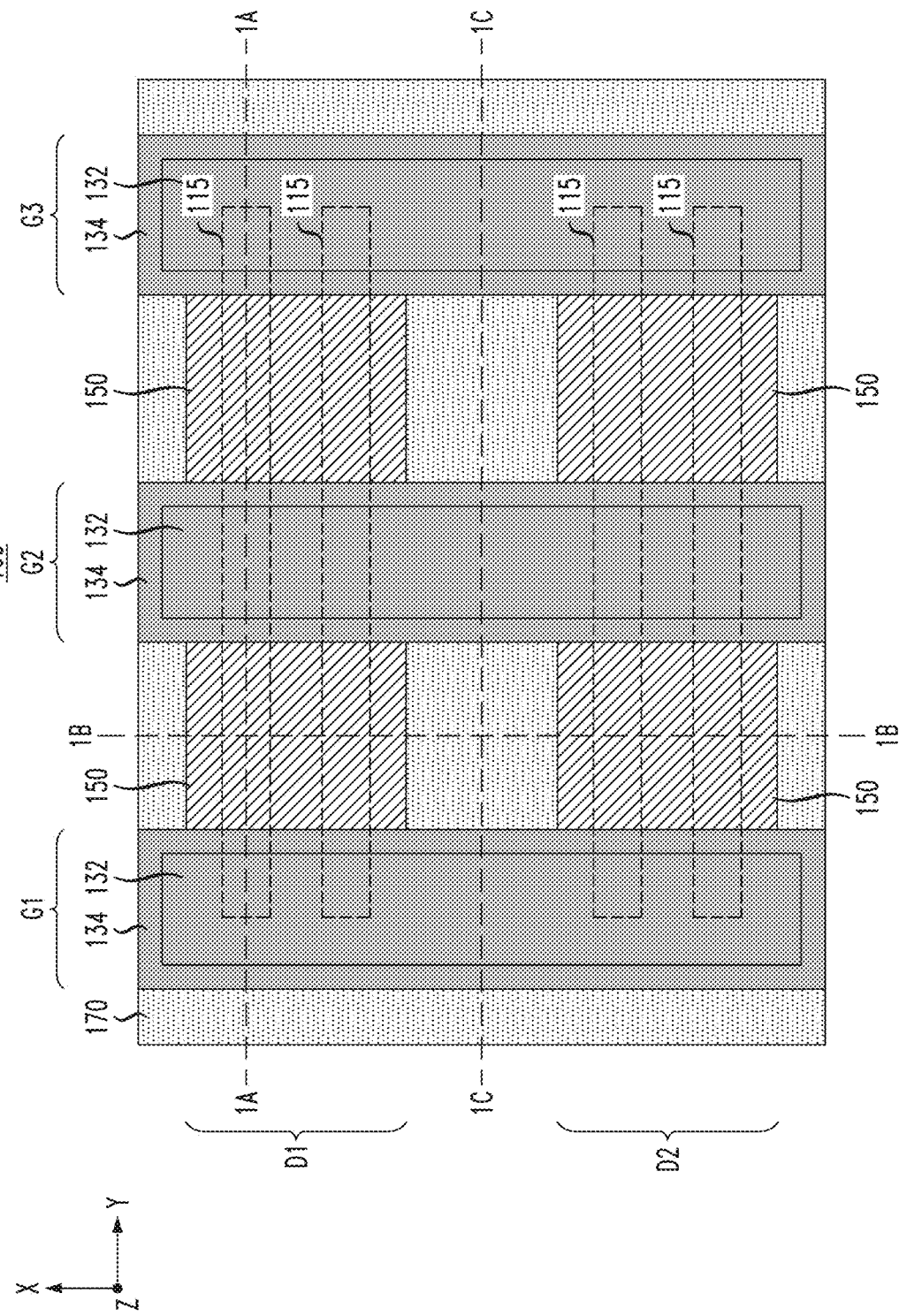

FIGS. 1A, 1B, 1C, and 1D are schematic views of a semiconductor integrated circuit device 100 at an intermediate stage of fabrication after performing an ILD layer replacement process to replace a sacrificial ILD layer with a low-k ILD layer, according to an embodiment of the invention. FIG. 1D is a schematic top plan view (X-Y plane) of the semiconductor integrated circuit device 100, while FIGS. 1A, 1B and 1C are cross-sectional side views of the semiconductor IC device 100 along planes that are represented by respective lines shown in FIG. 1D. In particular, FIG. 1A is a schematic cross-sectional side view (Y-Z plane) of the semiconductor IC device 100 along line 1A-1A in FIG. 1D. FIG. 1B is a schematic cross-sectional side view (X-Z plane) of the semiconductor IC device 100 along line 1B-1B in FIG. 1D. FIG. 1C is a schematic cross-sectional side view (Y-Z plane) of the semiconductor IC device 100 along line 1C-1C in FIG. 1D.

As shown in FIGS. 1A, 1B, 1C and 1D, the semiconductor IC device 100 comprises a semiconductor substrate 110, a shallow trench isolation (STI) layer 120, a plurality of vertical semiconductor fins 115, gate structures G1, G2, and G3, source/drain (S/D) layers 140, source/drain contacts 150 (e.g., trench silicide (T/S contacts), and a low-k ILD layer 170. The gate structures G1, G2, and G3 comprise high-k dielectric/metal gate (HKMG) structures 130, gate capping layers 132, and gate sidewall spacer 134, which are formed over respective channel regions of the vertical semiconductor fins 115. In some embodiments, the gate structures G1, G2, and G3 are formed using a replacement metal gate (RMG) process in which dummy gate structures are initially formed and then replaced with the HKMG structures 130 using known methods. The gate capping layers 132 and gate sidewall spacers 134 are formed of dielectric materials such as silicon nitride (SiN), silicon boron carbon nitride (SiBCN), and other types of dielectric materials commonly used to form gate capping layers and gate sidewall spacers.

As shown in FIGS. 1A, 1B and 1D, the portions of the vertical semiconductor fins 115 which are disposed between the gate structures G1, G2, and G3 serve as source/drain regions for first and second FinFET devices D1 and D2. In some embodiments, the source/drain layers 140 comprise epitaxial semiconductor layers that are grown on the portions of the vertical semiconductor fins 115 that are disposed between the gate structures G1, G1, and G3. As shown in the exemplary embodiment of FIGS. 1B and 1D, each FinFET device D1 and D2 is a multi-fin FinFET structure comprising two vertical semiconductor fins 115, wherein the source/drain layers formed on portions of adjacent vertical semiconductor fins 115 are merged to form common source/drain layers 140, and wherein the source/drain layers 140 on each side of the gate structure G2 are commonly connected to a respective single vertical source/drain contact 150.

In the example embodiment FIGS. 1A-1D, the middle gate structure G2 comprises a functional gate structure of the first and second FinFET devices D1 and D2, while the gate structures G1 and G3 are non-functional gate structures that are utilized for purposes of, e.g., facilitating uniform formation of the source/drain layers 140 and the source/drain contacts 150 on each side of the functional gate structure G2, and providing isolation for the source/drain layers 140, etc. The functional gate structure G2 extends over the channel regions of the vertical semiconductor fins 115 for both FinFET devices D1 and D2. In this configuration, the gate structure G2 serves as a common gate structure for the FinFET devices D1 and D2, with the source/drain layers 140 formed on opposing sides of the functional gate structure G2.

On the other hand, the end portions of the vertical semiconductor fins 115 of the FinFET devices D1 and D2 terminate inside the non-functional gate structures G1 and G3 and, thus, are not exposed on the opposite sides of the gate structures G1 and G3. As such, the vertical semiconductor fins 115 of the non-functioning gate structures G1 and G3 are not functional FET channel layers, and the non-functioning gate structures G1 and G3 merely serve as structures to confine the epitaxial growth of the semiconductor material which forms the source/drain layers 140, as well as confine the size of the source/drain contacts 150.

The ILD layer 170 comprises a low-k dielectric material which is formed as part of an ILD replacement process module following a RMG process module and a source/drain contact process module. As explained in further detail below, the ILD replacement process is performed to remove portions of an initial sacrificial ILD layer 125 (e.g., silicon oxide material) disposed between the gate structures G1, G2 and G3 and the source/drain contacts 150 (see FIG. 1B). The initial sacrificial ILD layer 125 can be formed of a material such as silicon oxide, and replaced with a low-k dielectric material (e.g., k<3.0, where is wherein k denotes a relative dielectric constant). The ILD layer 170 can be formed with Octamethylcyclotetrasiloxane (OMCTS), SiCOH, porous dielectrics, and other known ultra-low-k (ULK) dielectric materials (with k less than about 2.7) which would provide low dielectric permittivity, resulting in power consumption and signal delay in the semiconductor integrated circuit device 100. As further explained below, embodiments of the invention include various techniques that are incorporated as part the exemplary ILD replacement modules to protect the source/drain contacts 150 from damage when replacing the initial sacrificial ILD material 125 with the low-k dielectric material.

Figure 2A:
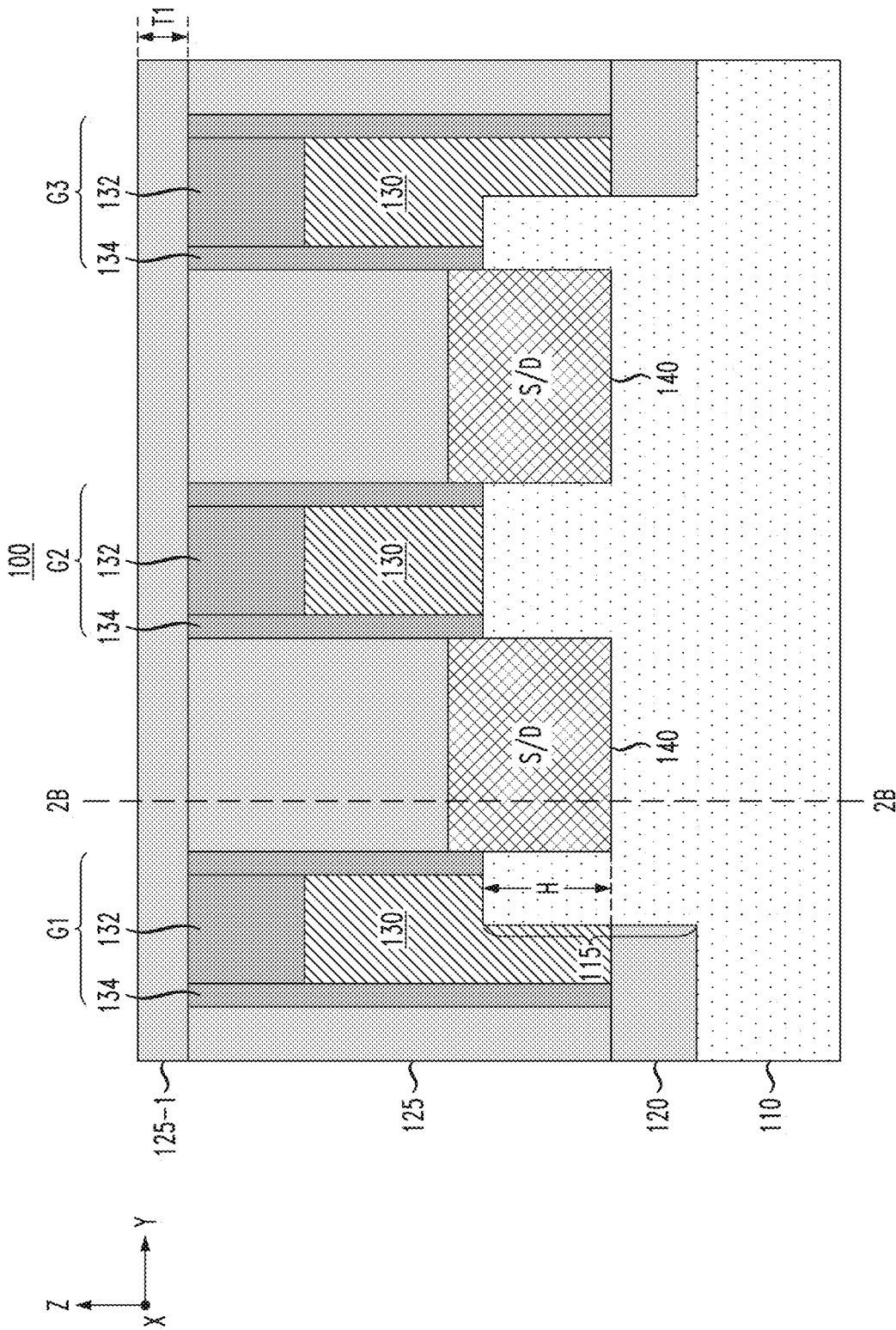

FIGS. 2A through 7 schematically illustrate a process for fabricating a semiconductor integrated circuit device in which an ILD layer replacement process is implemented to replace an initial sacrificial ILD layer with a low-k ILD layer, according to an embodiment of the invention. To begin, FIGS. 2A and 2B are schematic views of the semiconductor IC device 100 at an intermediate stage of fabrication in which FinFET devices D1 and D2 with source/drain layers 140 and metal gate structures G1, G2, and G3 are formed on a semiconductor substrate 110 and encapsulated in sacrificial ILD layers 125 and 125-1. In particular, FIG. 2A is a schematic cross-sectional side view (Y-Z plane) of the semiconductor IC device of FIG. 1A at an initial stage of fabrication, and FIG. 2B is a schematic cross-sectional side view (X-Z plane) of the semiconductor IC device along line 2B-2B shown in FIG. 2A. The intermediate device structure shown in FIGS. 2A and 2B can be fabricated using known methods and materials.

For example, while the semiconductor substrate 110 is illustrated as a generic substrate layer, the semiconductor substrate 110 may comprise various structures and layers of semiconductor material. In some embodiments, the semiconductor substrate 110 is a bulk semiconductor substrate (e.g., wafer) that is formed of silicon (Si) or germanium (Ge), or other types of semiconductor substrate materials that are commonly used in bulk semiconductor fabrication processes such as a silicon-germanium alloy, compound semiconductor materials (e.g. III-V), etc. In other embodiments, the semiconductor substrate 110 is an active semiconductor layer of an SOI (silicon-on-insulator) substrate, GeOI (germanium-on-insulator) substrate, or other type of semiconductor-on-insulator substrate, which comprises an insulating layer (e.g., oxide layer) disposed between a base substrate layer (e.g., silicon substrate) and the active semiconductor layer (e.g., Si, Ge, etc.) in which active circuit components are formed as part of a front-end-of-line (FEOL) structure. It is to be noted that in each drawing, the X-Y plane represents a plane that is parallel to the plane of the semiconductor substrate 110 (e.g., wafer) being processed.

Figure 2B:
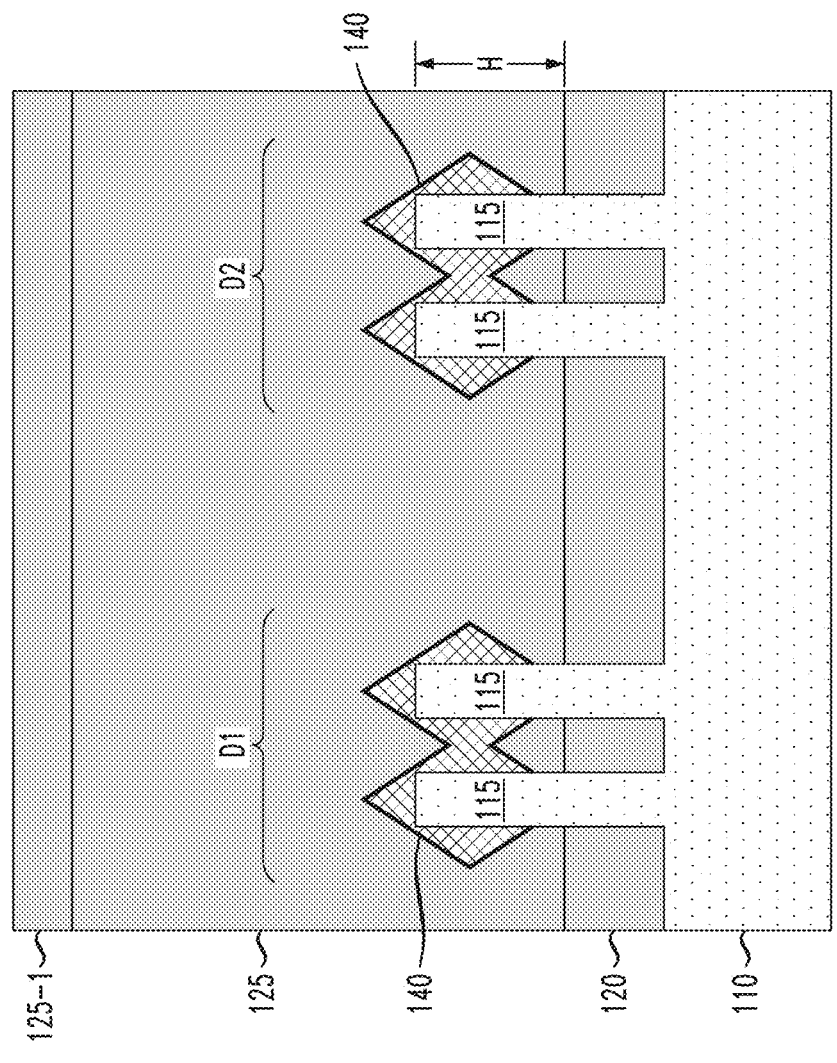
FIG. 2B is a schematic cross-sectional side view of the semiconductor IC device along line 2B-2B shown in FIG. 2A.

The STI layer 120 and the vertical semiconductor fins 115 can be fabricated using various methods. For example, for bulk and SOI substrate embodiments, the vertical semiconductor fins 115 can be formed by patterning an active silicon layer (e.g., crystalline silicon, crystalline SiGe, III-V compound semiconductor material, etc.) at the surface of a bulk semiconductor substrate or the SOI substrate to form a pattern of vertical semiconductor fins in different device regions across the semiconductor wafer, four of which are shown in FIG. 2B for ease of illustration. In one embodiment, the vertical semiconductor fins 115 are patterned from a crystalline Si or SiGe layer that is epitaxially grown on top of a bulk silicon substrate or a bulk germanium substrate. A crystalline SiGe layer that is formed using an epitaxial growth process may comprise a relaxed SiGe layer or a strained SiGe layer. As is known in the art, strain engineering is utilized to enhance the carrier mobility for MOS transistors, wherein different types of Si—SiGe heterostructures can be fabricated to obtain and/or optimize different properties for CMOS FET devices. For example, silicon can be epitaxially grown on a SiGe substrate layer to form a strained Si layer. Moreover, a strained SiGe layer can be epitaxially grown on a silicon substrate layer. A strained-Si/relaxed-SiGe structure provides a tensile strain which primarily improves electron mobility for n-type FET devices, while a strained-SiGe/relaxed-Si structure provides a compressive strain which primarily improves hole mobility for p-type FET devices.

After forming the vertical semiconductor fins 115, a layer of insulating material can be deposited to cover the vertical semiconductor fins 115, and then planarized (via chemical-mechanical planarization (CMP)) down to the top of the vertical semiconductor fins 115, and then further recessed using an etch-back process (e.g., dry etch process such as selective Reactive Ion Etch (ME) process, a wet etch process, or a combination of dry and wet etch processes) to form the STI layer 120. As shown in FIG. 2A, the STI layer 120 is etched down to a target level to expose upper portions of the vertical semiconductor fin structures 115, which defines a baseline active fin height H for the FinFET devices D1 and D2. For illustrative purposes, an upper surface of the isolation layer 120 is shown in phantom as a dashed line in FIGS. 1A and 2A to show the baseline active fin height H. In one embodiment of the invention, the isolation layer 120 is selectively etched using RIE, although other etching processes may be employed. A timed etch can be performed to remove a desired amount of insulating material to expose the upper portions of the vertical semiconductor fin structures 115.

In another embodiment, the vertical semiconductor fins 115 can be formed using a process in which the STI layer 120 is first deposited and then etched using RIE or deep RIE to form a pattern of trenches in the isolation layer 120 down to the semiconductor substrate 110, which corresponds to a pattern of vertical semiconductor fins to be formed. The vertical semiconductor fins 115 are then formed by epitaxially growing crystalline semiconductor material, starting on the exposed surfaces of the semiconductor substrate 110 at the bottom of the trenches, using ART (aspect ratio trapping) techniques. ART enables selective epitaxial growth of crystalline Si, SiGe, or III-V compound semiconductor material, for example, to fill high aspect ratio trenches formed in an insulating layer, and thereby form high quality active channel layers for FinFET devices. The crystalline SiGe layer (or other types of epitaxial semiconductor layers) can be epitaxially grown using known techniques, such as CVD (chemical vapor deposition), MOCVD (metal-organic chemical vapor deposition), LPCVD (low pressure chemical vapor deposition), MBE (molecular beam epitaxy), VPE (vapor-phase epitaxy), MOMBE (metal organic molecular beam epitaxy), or other known epitaxial growth techniques.

Next, dummy gate structures are fabricated using any known process flow which comprises, e.g., sequentially depositing a dummy gate oxide layer (e.g., silicon oxide), a dummy gate electrode layer (e.g., polysilicon or amorphous silicon), and hardmask layer (e.g., SiN) over the substrate and patterning the layers to form dummy gate structures with dummy gate capping layers to define gate regions of the gate structures G1, G2, and G3. The gate sidewall spacers 134 are formed by depositing one or more conformal layers of dielectric materials over the dummy gate structures, and then patterning the conformally deposited dielectric layer(s) to form the gate sidewall spacers 134. The gate sidewall spacers 134 are formed of one or more layers of dielectric material such as SiN, SiBCN, SiOCN, or other dielectric materials which are suitable for use as insulating gate sidewall spacers for gate structures of FinFET devices. The one or more layers of dielectric material can be deposited using plasma-enhanced chemical vapor deposition (PECVD), atomic layer deposition (ALD), or other suitable deposition methods which enable the deposition of thin films of dielectric material with high conformality, and then patterned using a directional dry etch process (e.g., RIE) as is known in the art.

After forming the gate sidewall spacers 134, the process flow continues with forming the source/drain layers 140 on the exposed S/D regions of the vertical semiconductor fins 115. In one embodiment of the invention, the source/drain layers 140 are formed by growing epitaxial semiconductor material on the exposed surfaces of the S/D regions of the vertical semiconductor fins 115 adjacent to the gate structures G1, G2 and G3. The type of epitaxial material and doping used to form the source/drain layers 140 will vary depending on whether the FinFET devices D1 and D2 are P-type or N-type devices. As shown in FIG. 2B, the source/drain layers 140 are epitaxially grown so that adjacent source/drain layers 140 formed on adjacent S/D regions of the vertical semiconductor fins 115 for the respective FinFET devices D1 and D2 and can merge (in the X-direction) to collectively form a single source/drain layer.

In some embodiments, the source/drain layers 140 are doped using known techniques. For example, in one embodiment, the source/drain layers 140 are "in-situ" doped during epitaxial growth by adding a dopant gas to the source deposition gas (i.e., the Si-containing gas). Suitable n-type dopants include but are not limited to phosphorous (P) and arsenic (As), and suitable p-type dopants include but are not limited to boron (B). Exemplary dopant gases may include a boron-containing gas such as BH3 for pFETs or a phosphorus or arsenic containing gas such as PH3 or AsH3 for nFETs, wherein the concentration of impurity in the gas phase determines its concentration in the epitaxially grown semiconductor material. The use of an in-situ doping process is merely an example. For instance, an ex-situ process may be used to introduce dopants into the source/drain layers. Other doping techniques can be used to incorporate dopants in the source/drain layers. Dopant techniques include but are not limited to, ion implantation, gas phase doping, plasma doping, plasma immersion ion implantation, cluster doping, infusion doping, liquid phase doping, solid phase doping, in-situ epitaxy growth, or any suitable combination of those techniques.

Following formation of the source/drain layers 140, the process flow continues with depositing and planarizing a layer of dielectric material to form the initial sacrificial ILD layer 125. The sacrificial ILD layer 125 is formed, for example, by depositing a layer of insulating material over the surface of the semiconductor substrate to cover the dummy gate structures, and then planarizing the surface of the semiconductor substrate down to upper surface of a hard mask layer (or dummy gate capping layer) of the dummy gate structures. In some embodiments, the sacrificial ILD layer 125 is formed of silicon oxide. The sacrificial ILD layer 125 may comprise a single deposited layer of insulating material, or multiple layers of insulating material (e.g., a first layer of a flowable oxide and a second layer of insulating material formed on the first layer). The sacrificial ILD layer 125 may be deposited using known deposition techniques, such as, for example, ALD, PECVD, PVD (physical vapor deposition), or spin-on deposition.

Following formation of the sacrificial ILD layer 125, the process flow continues with a replacement metal gate (RMG) process to remove the sacrificial material (e.g., dummy gate electrode layers and dummy gate oxide layers) of the dummy gate structures, and form the HKMG structures 130 in place of the dummy gate structures. For example, an RMG process comprises removing the dummy gate capping layers to expose the underlying sacrificial material of the dummy gate electrode layers (sacrificial polysilicon layer, or amorphous silicon layer), removing the dummy gate electrode layers selective to the materials of the dummy gate oxide layer and the gate sidewall spacers 134. The sacrificial dummy gate electrode layers can be removed using a selective dry etch or wet etch process with suitable etch chemistries, including ammonium hydroxide (NH$_4$OH), tetramethylammonium hydroxide (TMAH), or SF6 plasma. The etching of the dummy gate electrode layer is selective to the dummy gate oxide layer to thereby protect the portions of the vertical semiconductor fins 115 within the gate regions G1, G2 and G3 from being etched during the dummy gate electrode etch process. After the dummy gate electrode layers are removed, an oxide etch process is performed to etch away the dummy gate oxide layers selective to the materials of the vertical semiconductor fins 115 and the gate sidewall spacers 134. In this manner, the sacrificial materials (e.g., dummy polysilicon and oxide layers) of the dummy gate structures are etched away without damaging the exposed portions of the vertical semiconductor fins 115 within the gate regions G1, G2, and G3.

In one embodiment, the HKMG structures 130 are formed by depositing one or more conformal layers of high-k gate dielectric material to conformally cover the exposed surfaces of the vertical semiconductor fins 115 within the gate regions G1, G2, and G3, followed by the deposition of one or more layers of metallic material over the conformal deposited high-k gate dielectric material to fill the gate regions G1, G2 and G3 with the metallic material. The conformal high-k gate dielectric layers are formed of a high-k dielectric material having a dielectric constant (k) of about 3.9 or greater. For example, the gate dielectric material can include but is not limited to metal oxides such as hafnium oxide, hafnium silicon oxide, hafnium silicon oxynitride, hafnium zirconium oxide, and nitride films thereof. In other embodiments, the high-k dielectric may comprise lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric material may further include dopants such as lanthanum and aluminum. In one embodiment of the invention, the conformal gate dielectric layer is formed with a thickness in a range of about 0.5 nm to about 2.0 nm, which will vary depending on the target application. The conformal layer of high-k gate dielectric material is deposited using known methods such as ALD, for example, which allows for high conformality of the gate dielectric material.

The layers of metallic material for the HKMG structures 130 can include one or more conformal work function metal (WFM) layers that are deposited over the conformal layer of high-k gate dielectric material. In one embodiment, a total thickness of the conformal WFM material is in a range of 2 nm to about 5 nm. The WFM layers are used to obtain target work functions which are suitable for the type (e.g., n-type or p-type) of FinFET devices D1 and D2 that are to be formed and, thus, allow for tuning of the threshold voltages of the FinFET devices D1 and D2. For example, the WFM layers can include titanium nitride (TiN), and an aluminum (Al) containing alloy material such as titanium aluminum carbide (TiAlC), TiAl, AlC, etc. In other embodiments, the WFM layer may include, e.g., TaN, Zr, W, Hf, Ti, Al, Ru, Pa, ZrAl, WAl, TaAl, HfAl, TiAlC, TaC, TiC, TaMgC, or other types, compositions, or alloys of work function metals that are commonly used to obtain target work functions for threshold voltage tuning.

Furthermore, in some embodiments, the HKMG structures 130 comprise metallic gate electrode layers that are formed over the WFM layers to fill the gate regions G1 G2 and G3 with a lower resistance metal material such as tungsten, titanium, tantalum, cobalt, ruthenium, zirconium, copper, aluminum, platinum, tin, silver, etc. The layer of conductive material may further comprise dopants that are incorporated during or after deposition. The layer of conductive material is deposited using a suitable deposition process, for example, CVD, PECVD, PVD, plating, thermal or e-beam evaporation, sputtering, etc.

Following the deposition of the layers of gate dielectric and metallic materials to form the HKMG structures 130, a planarization process (e.g., CMP) is performed to polish the surface of the semiconductor structure down to the sacrificial ILD layer 125, and remove the overburden portions of the layers of gate dielectric and metallic materials. The gate capping layers 132 are then fabricated by a process which comprises recessing the upper surfaces of the HKMG structures 130 to a target level below the planarized surface of the substrate, depositing a layer of dielectric material (e.g., SiN) to fill the recessed regions above the recessed surfaces of the HKMG structures 130, and then planarizing the surface of the semiconductor structure down to the upper surface of the sacrificial ILD layer 125 to remove the overburden dielectric material and, thus, form the gate capping layers 132. An additional layer of sacrificial layer of ILD material 125-1 is then deposited and planarized, resulting in the semiconductor structure shown in FIGS. 2A and 2B. The additional layer of sacrificial ILD material 125-1 is formed with a thickness T1 in a range of about 10 nanometers (nm) to about 50 nm for the purpose of serving as a patterning layer to facilitate the formation of a source/drain contact in subsequent process steps. The process flow then continues with middle-of-the-line (MOL) processing to form the vertical source/drain contacts 150 and replace the sacrificial ILD layer 125 with the low-k ILD layer 170, using a process flow as FIGS. 3A through 7.

Figure 3A:
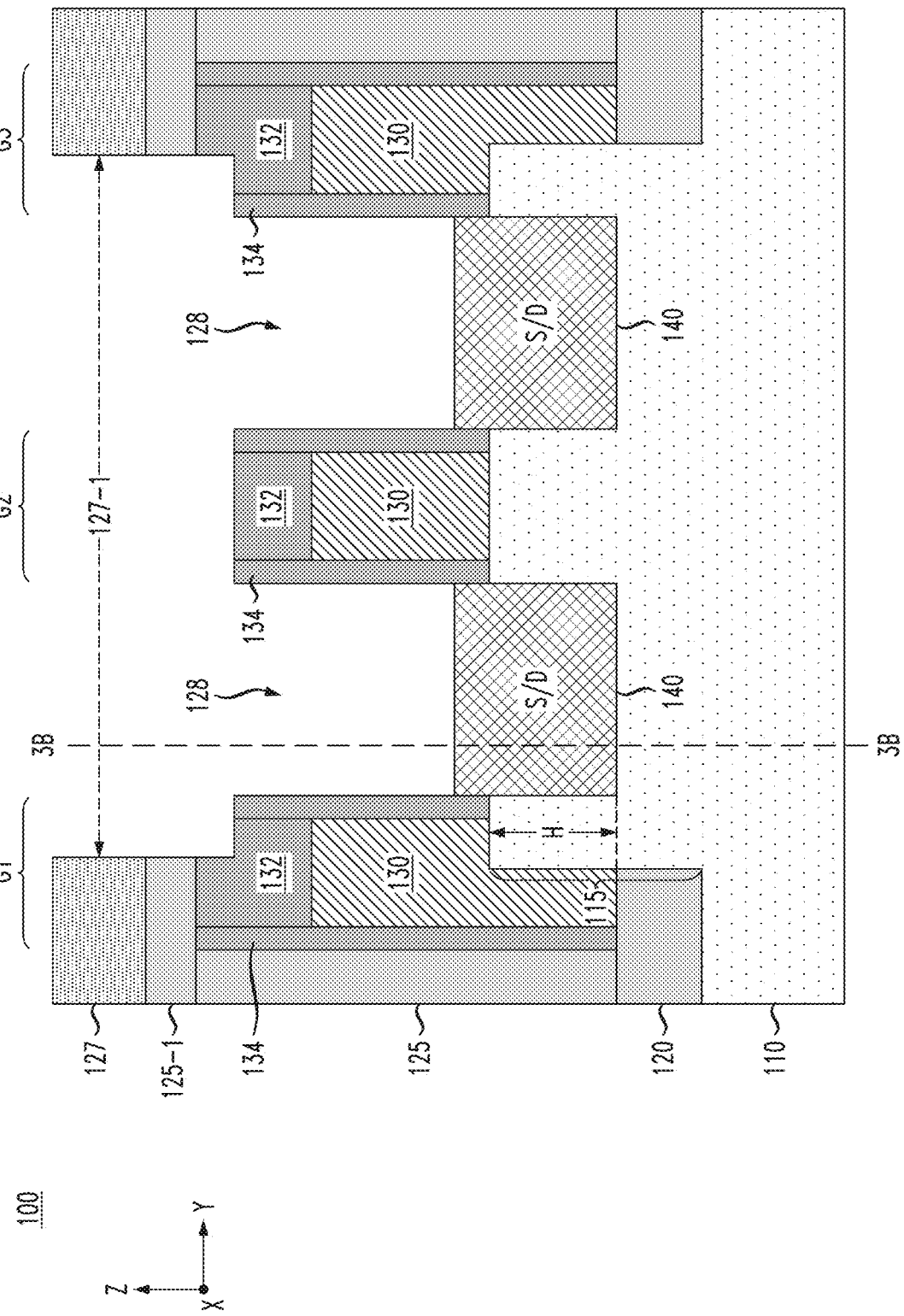
FIG. 3A is a schematic cross-sectional side view of the semiconductor IC device shown in FIG. 2A after forming an etch mask and patterning the sacrificial ILD layers using the etch mask to form source/drain contact openings that expose source/drain layers.
Figure 3B:
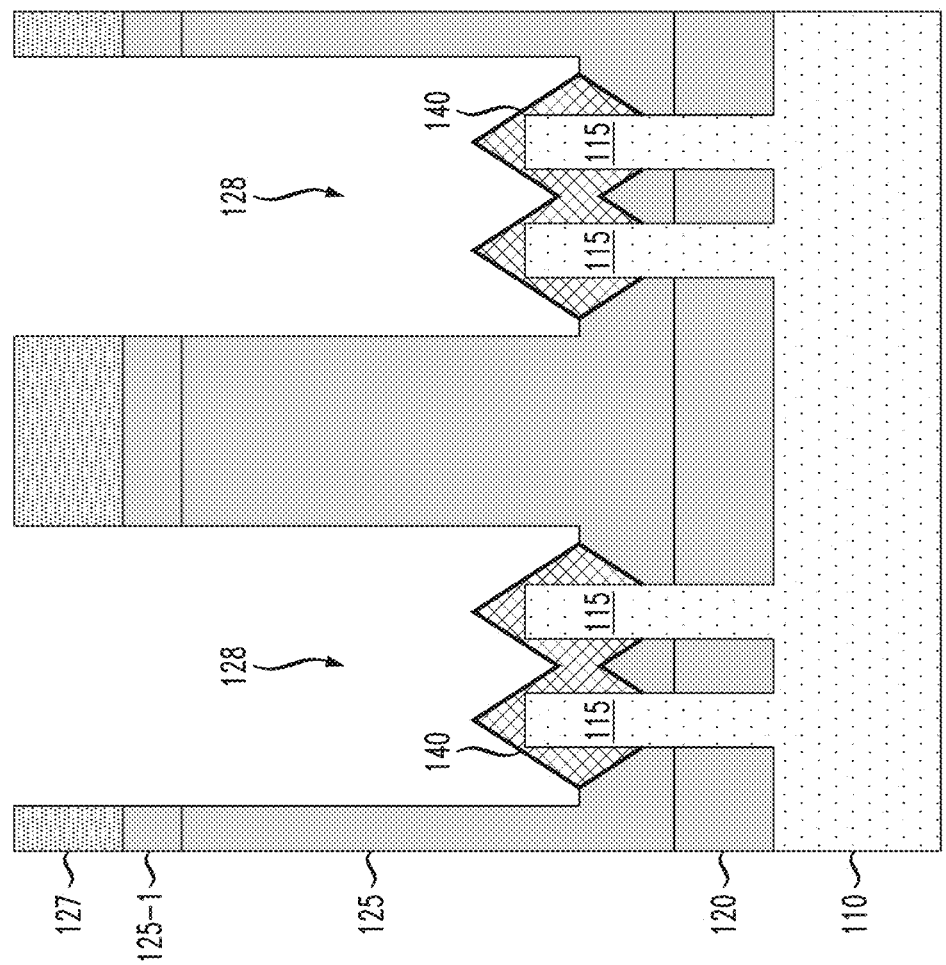
FIG. 3B is a schematic cross-sectional side view of the semiconductor IC device along line 3B-3B shown in FIG. 3A.

To begin, FIGS. 3A and 3B are schematic cross-sectional views of the semiconductor IC device shown in FIGS. 2A and 2B, respectively, after forming an etch mask 127 and patterning the sacrificial ILD layers 125 and 125-1 using the etch mask 127 to form source/drain contact openings 128 to expose the source/drain layers 140. The source/drain contact openings 128 are formed using known methods. For example, in one embodiment, the etch mask 127 is formed by depositing and lithographically patterning an organic planarizing layer (OPL) using known methods. As shown in FIG. 3A, to relax the alignment budget of the lithographic process, the etch mask 127 can be formed with an opening 127-1 that exposes the functional gate G2 and portions of the non-functional gates G1 and G3. In this regard, the opening 127-1 defines a "merged source/drain contact opening" (e.g., trench) that exposes the gate structure G2 and the source/drain layers 140 of the field-effect transistor device An anisotropic dry etch process (e.g., ME) is performed to etch the contact openings 128 between the gate structures G1, G2, and G3 down to a level that exposes at least upper portions of the source/drain layers 140, or to other target levels depending on the desired amount of contact area between the source/drain layers 140 and bottom regions of the vertical source/drain contacts to be formed in the contact openings 128. As shown in FIG. 3A, the dry etch process results in some vertical erosion of the exposed gate sidewall spacers 134 and gate capping layers 132 of the gate structures G1, G2, and G3. However, the gate sidewall spacers 134 and gate capping layers 132 are initially formed with an extra thickness to ensure that a sufficient amount of dielectric material of the gate sidewall spacers 134 and the gate capping layers 132 (with reduced thickness) remains above the HKMG structures 130 to properly encapsulate the HKMG structures 130.

Figure 4A:
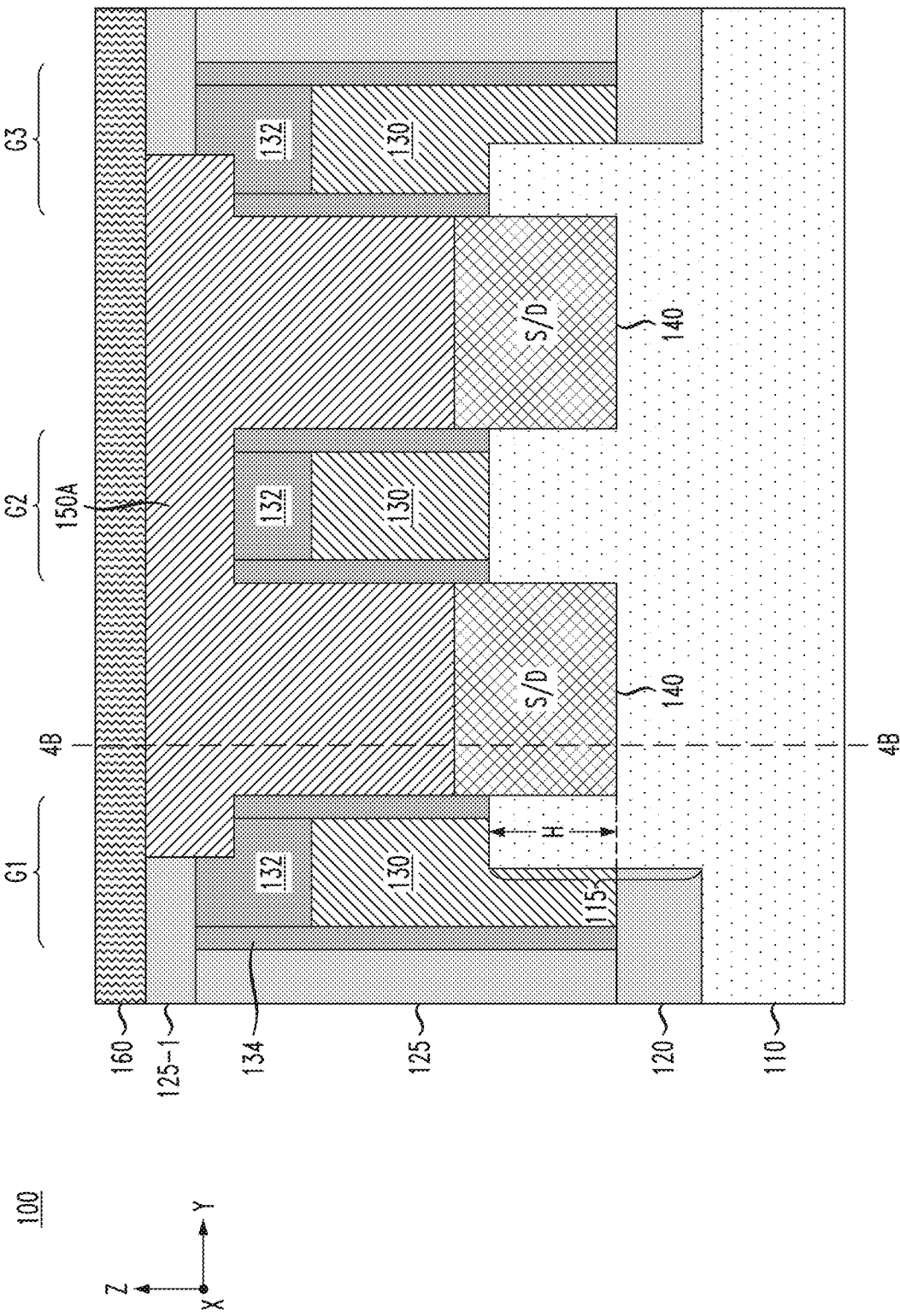
FIG. 4A is a schematic cross-sectional side view of the semiconductor IC device shown in FIG. 3A after stripping away a remaining portion of the etch mask, performing a source/drain contact metallization process to fill the source/drain contact openings with contact metallization, and after forming a semiconductor layer over the sacrificial ILD layer and the contact metallization.
Figure 4B:
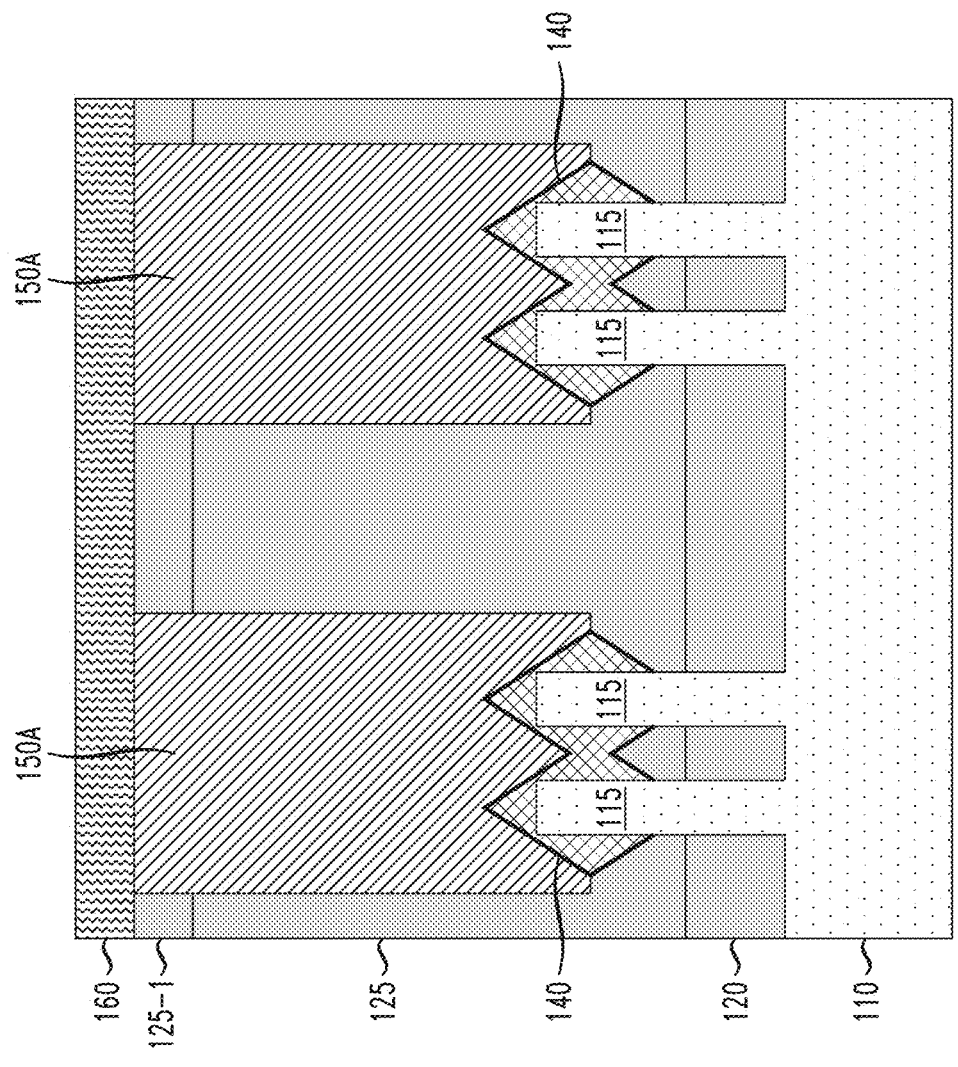
FIG. 4B is a schematic cross-sectional side view of the semiconductor IC device along line 4B-4B shown in FIG. 4A.

Next, FIGS. 4A and 4B are schematic cross-sectional side views of the semiconductor IC device shown in FIGS. 3A and 3B, respectively, after stripping away a remaining portion of the etch mask 127, performing a source/drain contact metallization process to fill the source/drain contact openings 128 with contact metallization 150A, and after forming a semiconductor layer 160 over the sacrificial ILD layer 125-1 and the contact metallization 150A. In the exemplary embodiment of FIGS. 4A and 4B, the contact metallization 150A forms a merged source/drain contact structure in which the source/drain contacts within the contact openings 128 are initially connected by overburden metallic material of the contact metallization 150A disposed above the gate structure G2.

The etch mask 127 can be removed using standard OPL stripping methods. Further, in some embodiments where the vertical source/drain contacts 150 (FIG. 1A) comprise trench silicide (TS) contacts, the contact metallization 150A is formed by a process which comprises forming a stack of layers over the source/drain layers 140 in the contact 128 openings, wherein the layers comprise epitaxial contact layers formed on the source/drain layers 140, metallic contact liner layers formed on the epitaxial contact layers, and a metallic fill layer formed over the metallic contact liner layers. A thermal anneal process is subsequently performed at some point in the fabrication process to induce a reaction between the epitaxial contact layers and the metallic contact liner layers to form silicide contact layers on the source/drain layers 140, thereby forming the vertical TS source/drain contacts 150. In some embodiments, the epitaxial contact layers are omitted so the metallic contact liner layers are directly formed on the source/drain layers 140.

The epitaxial contact layers comprise epitaxial material that is epitaxially grown on the exposed surfaces of the source/drain layers 140 at the bottom of the contact openings 128. Prior to forming the epitaxial contact layers, a preclean process can be performed to remove any surface impurities or oxides from the exposed surfaces of the epitaxial source/drain layers 140, which would otherwise increase the contact resistance or resistivity of the resulting trenches silicide contacts. In one embodiment, the epitaxial contact layers are formed of an epitaxial material which is the same or similar to the epitaxial material of the source/drain layers 140, but with higher doping levels than the source/drain layers 140. The metallic contact liner layers comprise a thin layer of metallic material which, during a subsequent thermal anneal process, combines with the epitaxial contact layers to form trench silicide layers (or metallic-semiconductor alloy layers) as part of a salicidation process. Typically, silicide contacts are formed using transition metals such as nickel, cobalt, titanium, platinum, tungsten, tantalum, an alloy such as titanium-aluminum (TiAl) or titanium-nitride (TiN), etc., or any other suitable metallic material. The metallic contact liner layers can be deposited via ALD or CVD (in which case the metallic contact liners are conformally deposited on bottom and sidewall surfaces of the contact openings 128) or by PVD (in which case the metallic contact liners are primarily deposited on the bottom of the contact openings 128).

A metallic fill layer is then deposited over the metallic contact liners to fill the remaining spaces in the contact openings 128 with metallic material. In some embodiments, the metallic fill material comprises cobalt. In other embodiments, the metallic fill material comprises ruthenium. In other embodiments, the metallic fill material comprises copper. Metallic materials such as cobalt and ruthenium are exemplary of preferred metals utilized for the contact fill process as such metals can be deposited using relatively low deposition temperatures with deposition methods such as CVD, PECVD, PVD, ALD, etc. Furthermore, in some embodiments, before forming the metallic fill layer, a barrier layer and/or seed layer is conformally deposited to line the sidewall and bottom surfaces of the contact openings. For example, the barrier layer (or seed layer) is formed of a metallic material such as TiN or TaN. The barrier layer serves to prevent the diffusion of metallic material from the metallic fill layer into the surrounding ILD layer (e.g., the low-k ILD layer 170 which is subsequently formed). A seed layer serves as a wetting layer for the metallic fill deposition process.

Following the metal deposition process to fill the contact opening 128, a planarization process (e.g., chemical mechanical polishing (CMP) process) is performed to remove the overburden metallic material from the upper surface of the sacrificial ILD layer 125-1, and form a planarized surface. The semiconductor layer 160 is then formed on the planarized surface, resulting in the semiconductor structure shown in FIGS. 4A and 4B. In one embodiment, the semiconductor layer 160 comprises an amorphous silicon layer which is formed by depositing a layer of silicon material using a PVD process. The PVD process enables the formation of a layer of amorphous silicon using a relatively low deposition temperature. In other embodiments, the semiconductor layer 160 is formed using other types of semiconductor materials such as silicon germanium, germanium, etc.

Figure 5:
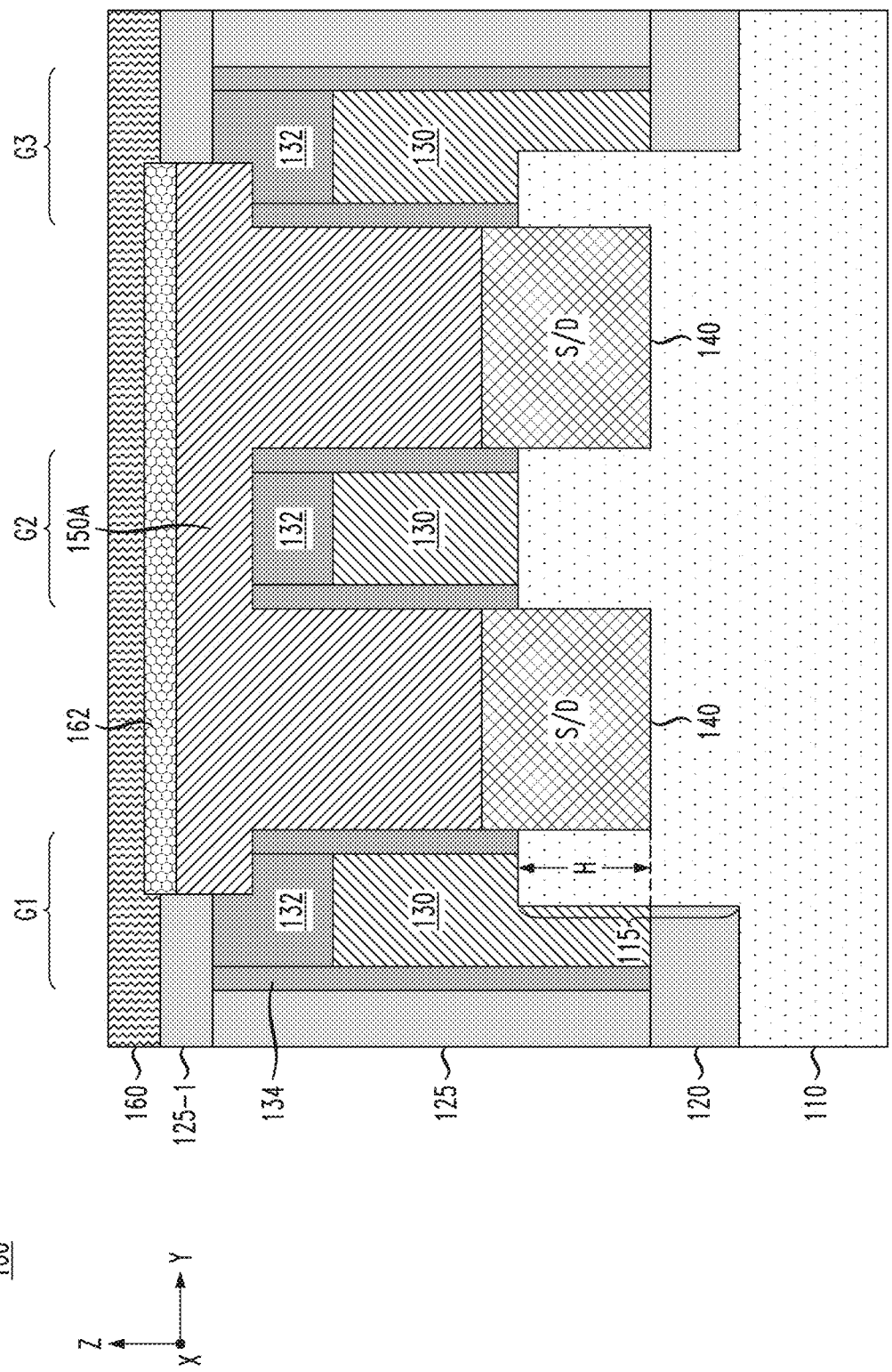

Following deposition of the semiconductor layer 160, a thermal anneal process is performed at a suitable temperature and duration to induce a reaction between the semiconductor material of the semiconductor layer 160 and the metallic material in the upper surface region of the contact metallization 150A form metal-semiconductor alloy capping layers (e.g., silicide capping layers). In some embodiments, the thermal anneal process includes laser anneal, flash anneal, rapid thermal anneal, or any suitable combination of those techniques. For example, FIG. 5 is a schematic cross-sectional side view of the semiconductor IC device of FIG. 4A after performing a thermal anneal process to induce a reaction between the semiconductor material of the semiconductor layer 160 and the metallic material in the upper surface region of the contact metallization 150A to form a metal-semiconductor alloy capping layer 162. Essentially, the thermal anneal process results in the formation of a thin metal-semiconductor capping layer 162 (e.g., CoSi, RuSi, CuSi, etc.) that is at least partially embedded in the upper surface region of the contact metallization 150A. At the completion of the thermal anneal processing, there will exist a remaining, unreacted portion of the semiconductor layer 160.

The metal-semiconductor alloy capping layer 162 serves as a protective capping layer to protect the contact metallization 150A from damage and contamination as a result of the etch processes (e.g., RIE) and deposition processes that are subsequently performed to replace the sacrificial ILD layers 125 and 125-1 with the low-k ILD layer 170. The formation of the protective metal-semiconductor capping layer 162 using the deposited semiconductor layer 160 and thermal anneal process ensures sufficient coverage of the protective capping layer 162 over the surface of the contact metallization 150A. This is to be contrasted with conventional methods for fabricating protective capping layers on metallization layer using selective deposition techniques to selectively deposit metallic capping layers (e.g., tungsten) on the surfaces of the metallization, which can result in insufficient coverage (e.g., voids) of the selectively deposited metallic capping layers.

Figure 6A:
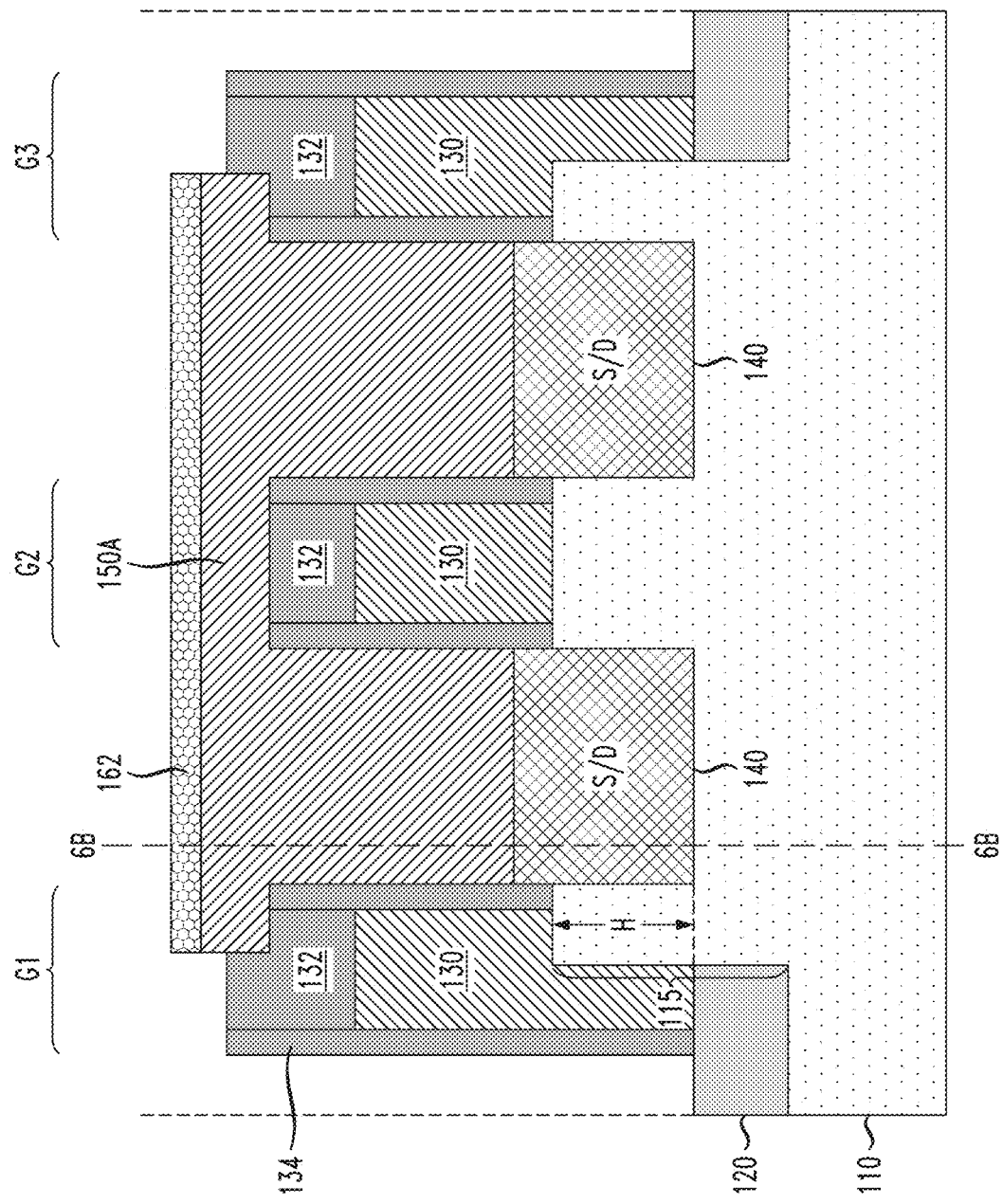
FIG. 6A is a schematic cross-sectional side view of the semiconductor IC device of FIG. 5 after stripping away unreacted portions of the semiconductor layer which remain following the thermal anneal process, and performing an etch process to remove the sacrificial ILD layers.
Figure 6B:
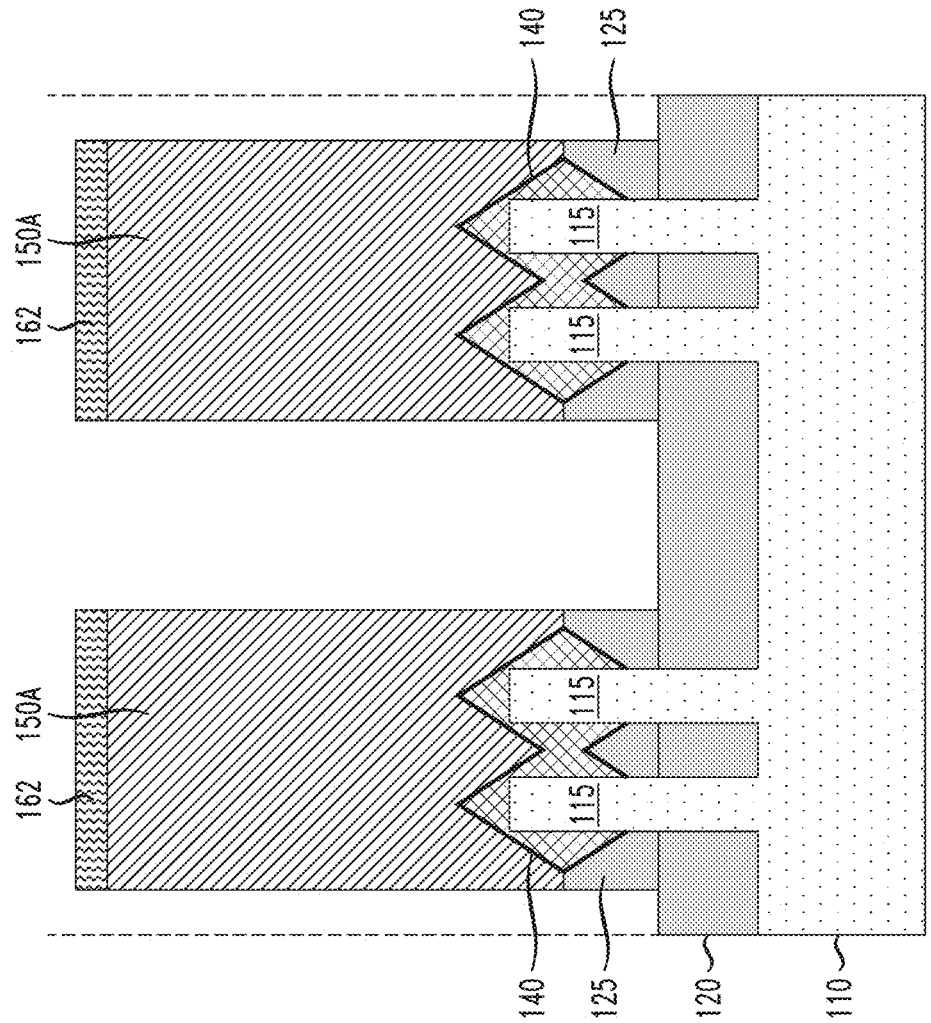
FIG. 6B is a schematic cross-sectional side view of the semiconductor IC device along line 6B-6B shown in FIG. 6A.

Next, FIG. 6A is a schematic cross-sectional side view of the semiconductor IC device of FIG. 5 after stripping away an unreacted portion of the semiconductor layer 160 which remains following the thermal anneal process, and after performing an etch process to remove the sacrificial ILD layers 125-1 and 125. FIG. 6B is a schematic cross-sectional side view of the semiconductor IC device along line 6B-6B shown in FIG. 6A. The unreacted portion of the semiconductor layer 160 is removed selective to the protective capping layer 162 and the oxide materials of the sacrificial ILD layers 125 and 125-1 using known methods. For example, when the semiconductor layer 160 is formed of amorphous silicon, the remaining unreacted portion of the semiconductor layer 160 can be removed using the same or similar selective dry etch or wet etch processes (e.g., ammonium hydroxide ($NH_4OH$), tetramethylammonium hydroxide (TMAH), or SF6 plasma) as used in the RMG process discussed above for removing the sacrificial dummy gate electrode layer (e.g., sacrificial polysilicon or amorphous silicon).

Following the removal of the unreacted portion of the semiconductor layer 160, an etch back process is performed to remove the sacrificial ILD layers 125-1 and 125. In some embodiments, the etch back process is performed using a dry etch process (e.g., RIE process) to etch the oxide materials of the sacrificial ILD layers 125-1 and 125 selective to the silicide material (e.g., CoSi, RuSi, or CuSi, etc.) of the protective capping layer 162 and the nitride materials (e.g., SiN) of the gate capping layers 132 and the gate sidewall spacers 134. In some embodiments, the etch back process is performed to etch the sacrificial ILD layer 125 down to the level of the STI layer 120, resulting in the semiconductor IC device structure shown in FIGS. 6A and 6B. In some embodiments, as schematically illustrated in FIG. 6B, a residual amount of the original sacrificial ILD layer 125 may remain between the bottom surfaces of the source/drain layers 140 and the STI layer 120.

Figure 7:
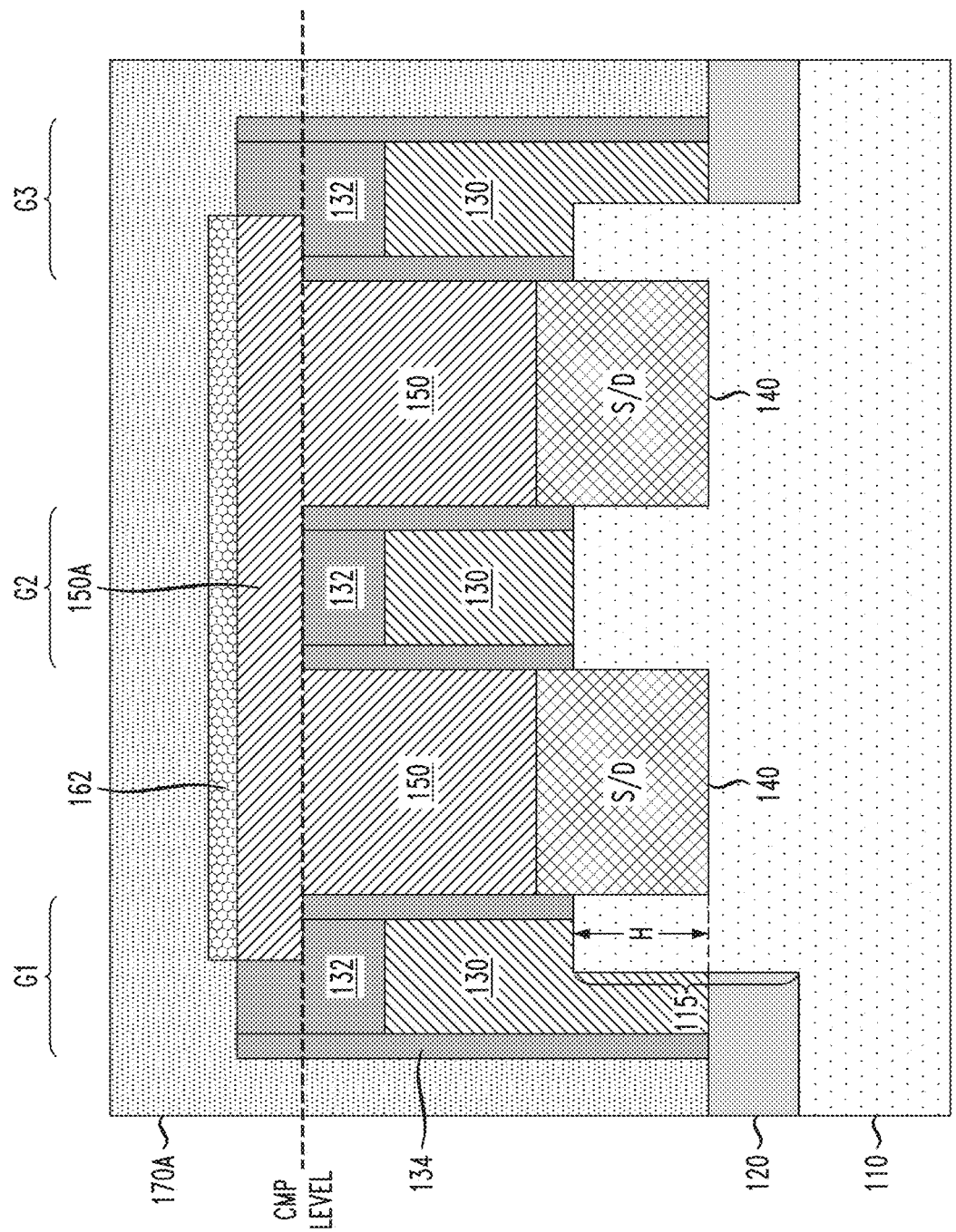

Next, FIG. 7 is a schematic cross-sectional side view of the semiconductor IC device of FIG. 6A after depositing a layer of low-k dielectric material 170A to replace the sacrificial ILD material. In some embodiments, the low-k dielectric material 170A comprises any type of low-k dielectric material which is suitable to serve as an ILD layer and which has a dielectric constant (k) of about 3.0 or less. For example, the low-k dielectric layer 170A may comprise a hybrid silica-based low-k dielectric material such as carbon-doped silicon glass (e.g., carbon-doped silicon glass (SiCOH) or organosilicate glass (SOG)), a fluorinated silicon glass (FSG), a low-k porous dielectric material, or a ULK (ultra-low-k) dielectric materials (with k less than about 2.5), etc. The low-k dielectric layer 170A is deposited using, for example, CVD, PECVD, spin-on deposition, or other deposition techniques that are suitable for form low-k dielectric layers.

In some embodiments, a thin conformal liner layer is conformally deposited before depositing the low-k dielectric layer 170A. The conformal liner layer serves as a diffusion barrier layer to prevent diffusion of the metallic material of the source/drain contacts 150 into the low-k dielectric ILD layer 170. The conformal liner layer can be formed of any material such as SiN, SiON, or SiCN, which is suitable to serve as a diffusion barrier for the given application.

Following the deposition of the low-k-dielectric layer 170A, a CMP process is performed to polish the surface of the semiconductor substrates down to a target level, as shown in FIG. 7 by a dashed line labeled "CMP level." The CMP process is performed to remove the protective capping layer 162, and to remove the merged portion of the contact metallization 150A above the gate structure G2 to form the discrete source/drain contacts 150. The CMP process further serves to planarize the surface of the semiconductor IC device to remove the overburden dielectric material 170A and make the upper surfaces of the gate structures G1, G2, and G3 coplanar, resulting in the semiconductor IC device shown in FIGS. 1A, 1B, 1C and 1D with the low-k ILD layer 170.

Following the formation of the semiconductor structure shown in FIGS. 1A-1D, any known sequence of processing steps can be performed to complete the fabrication of the semiconductor integrated circuit device, the details of which are not needed to understand embodiments of the invention. Briefly, MOL processing can continue to form MOL contacts and vertical vias (e.g., gate contacts, source/drain via contacts, etc.). Then, a back-end-of-line (BEOL) process module can be performed to fabricate a BEOL interconnect structure which provides connections to/between the MOL contacts, and other active or passive devices that are formed as part of the front-end-of-line (FEOL) layer.

Figure 8:
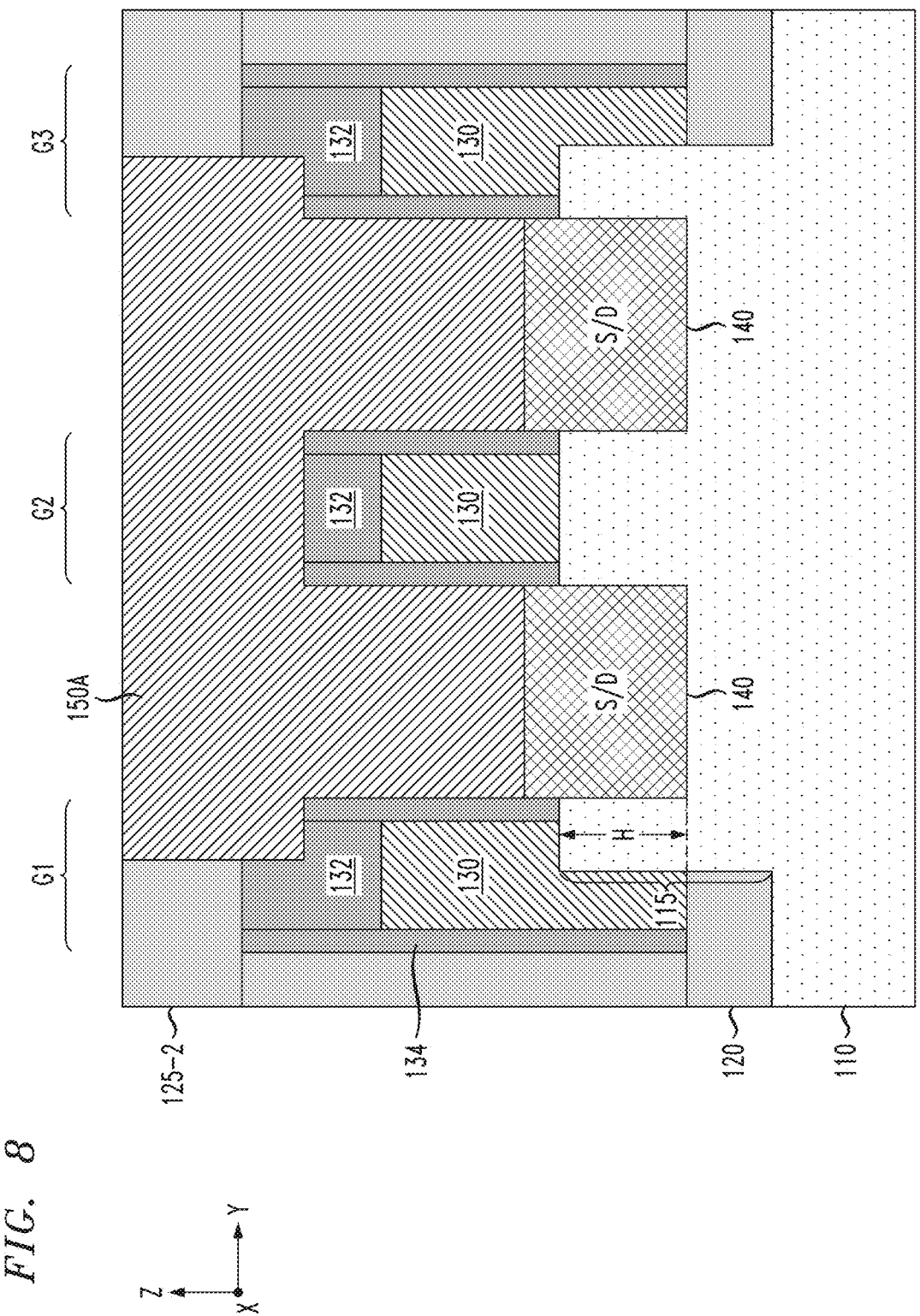
Figure 9:
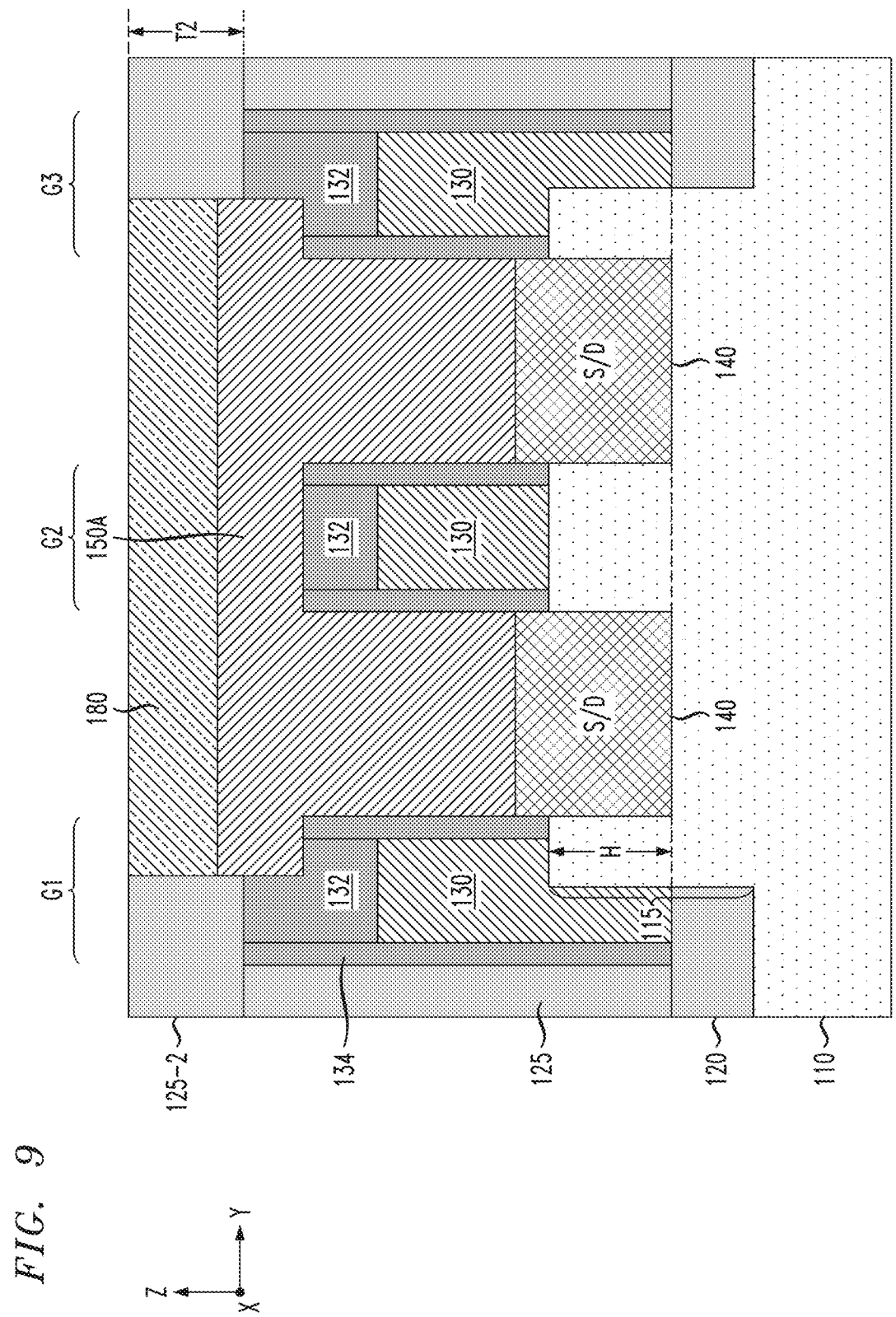
Figure 10:
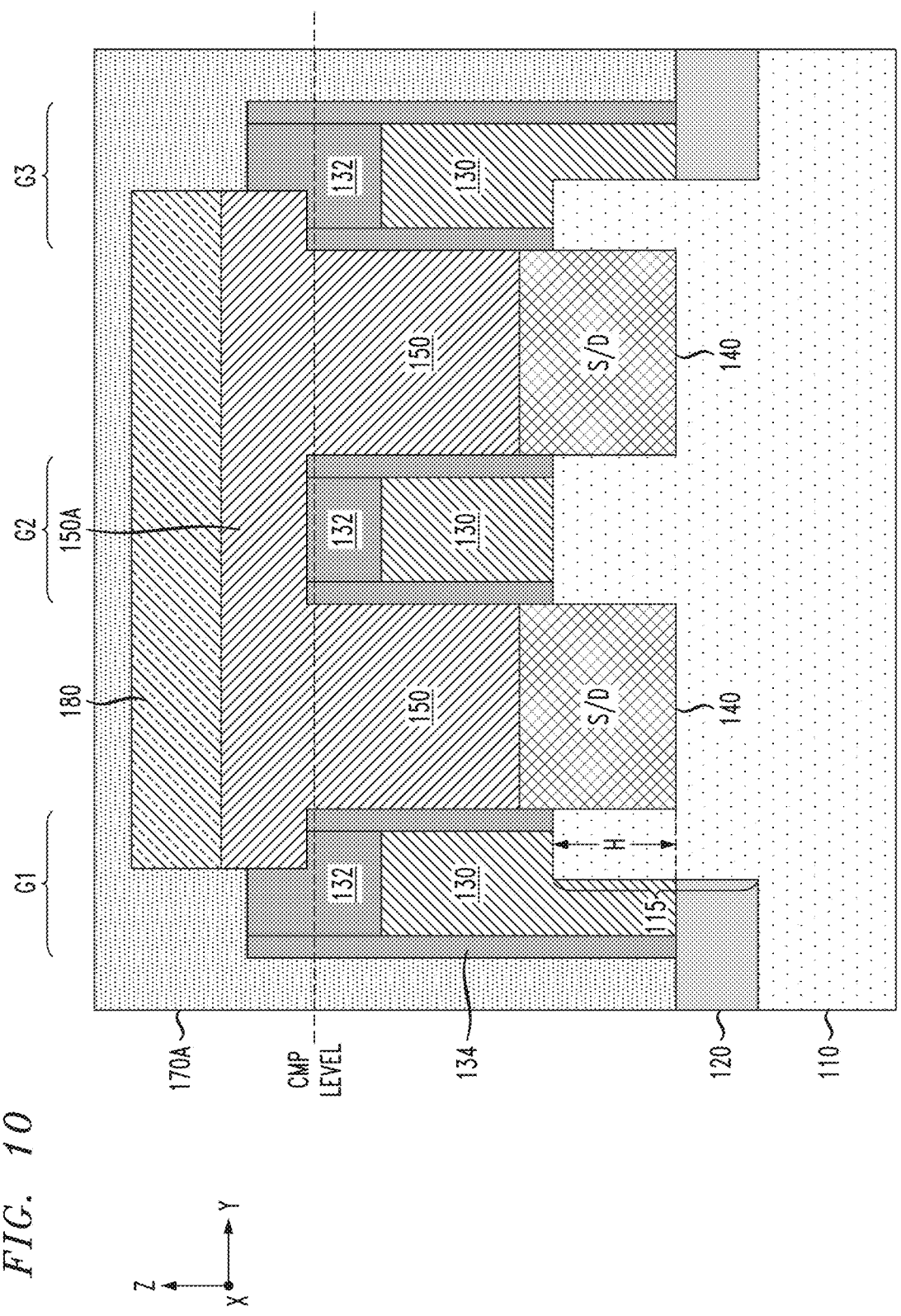

FIGS. 8 through 10 schematically illustrate a process for fabricating a semiconductor IC device in which an interlayer dielectric layer replacement process is implemented to replace an initial sacrificial ILD layer with a low-k ILD layer, according to another embodiment of the invention. The fabrication process schematically illustrated in FIGS. 8-10 provides an alternate embodiment for fabricating the semiconductor IC device 100 shown in FIGS. 1A-1D, in which the sacrificial material of the ILD layers 125 and 125-2 is replaced with the low-k ILD layer 170 while protecting the contact metallization 150A using a nitride capping layer.

To begin, FIG. 8 is a schematic cross-sectional side view of the semiconductor IC device 100 at an intermediate stage of fabrication wherein FinFET devices D1 and D2 with the source/drain layers 140 and metal gate structures G1, G2, and G3 are formed on the semiconductor substrate 110 and encapsulated in sacrificial ILD layers 125 and 125-2, and wherein source/drain contact metallization 150A is formed within source/drain contact openings etched in the sacrificial ILD layers 125 and 125-2. The intermediate semiconductor IC device structure shown in FIG. 8 is fabricated using the same or similar fabrication techniques as discussed above in conjunction with FIGS. 2A through 4B.

However, in the exemplary embodiment of FIG. 8, the additional layer of sacrificial ILD material 125-2 that is formed on the planarized surface of the sacrificial ILD layer 125 following the RMG process module is thicker than the additional layer of sacrificial ILD material 125-1 that is formed (see FIGS. 2A and 2B) on the planarized surface of the sacrificial ILD layer 125 following the RMG process module in the previously described embodiment. For example, the additional layer of sacrificial ILD material 125-2 is formed with a thickness T2 in a range of about 20 nm to about 80 nm, which is thicker than T1 (see, e.g., FIG. 2A). In this embodiment, the sacrificial ILD layer 125-2 is made thicker for the purpose of forming the protective dielectric capping layer 180 on top of the contact metallization 150A.

Next, FIG. 9 is a schematic cross-sectional side view of the semiconductor IC device of FIG. 8 after forming a protective dielectric capping layer 180 on the contact metallization 150A. The protective dielectric capping layer 180 is formed of a dielectric material that has etch selectivity with respect to the material (e.g., silicon oxide) of the sacrificial ILD layers 125 and 125-2. For example, in one embodiment, the protective dielectric capping layer 180 is formed of silicon nitride. The protective dielectric capping layer 180 is formed by a process which comprises recessing the upper surface of the contact metallization 150A to a target level below the planarized surface of the sacrificial ILD layer 125-2 and above the upper surfaces of the gate structures G1, G2 and G3, depositing a layer of dielectric material (e.g., SiN) to fill the recessed region above the recessed surface of the contact metallization 150A, and then planarizing the surface of the semiconductor structure down to the upper surface of the sacrificial ILD layer 125-2 to remove the overburden dielectric material and, thus, form the protective dielectric capping layer 180.

Next, FIG. 10 is a schematic cross-sectional side view of the semiconductor IC device of FIG. 9 after performing an etch back process to remove the sacrificial ILD layers 125-2 and 125 and after depositing a layer of low-k dielectric material 170A to replace the sacrificial ILD material. In one embodiment, the sacrificial ILD layers 125-2 and 125 are etched away using a dry etch process (e.g., RIE process) to etch the oxide materials of the sacrificial ILD layers 125-2 and 125 selective to the SiN materials of the protective capping layer 180, the gate capping layers 132, and the gate sidewall spacers 134. In some embodiments, the etch back process is performed to recess the sacrificial ILD layer 125 down to the level of the STI layer 120, resulting in the semiconductor IC device structure shown in FIG. 10. The protective dielectric capping layer 180 serves to protect the contact metallization 150A from damage and contamination as a result of the etch processes (e.g., RIE) and deposition processes that are subsequently performed to replace the sacrificial ILD layers 125 and 125-2 with the low-k ILD layer 170.

As noted above, the low-k dielectric material 170A comprises any type of low-k dielectric material which is suitable to serve as an ILD layer and which has a dielectric constant (k) of about 3.0 or less. In some embodiments, a thin conformal liner layer is conformally deposited before depositing the low-k dielectric layer 170A. The conformal liner layer serves as a diffusion barrier layer to prevent diffusion of the metallic material of the source/drain contacts 150 into the low-k dielectric ILD layer 170A.

Following the deposition of the low-k dielectric layer 170A, a CMP process is performed to polish the surface of the semiconductor substrates down to a target level, as shown in FIG. 10 by a dashed line labeled "CMP level." The CMP process is performed to remove the protective capping layer 180, and to remove the merged portion of the contact metallization 150A above the gate structure G2 to form the discrete source/drain contacts 150. The CMP process further serves to planarize the surface of the semiconductor IC device to remove the overburden dielectric material 170A and make the upper surfaces of the gate structures G1, G2, and G3 coplanar, resulting in the semiconductor IC device shown in FIGS. 1A, 1B, 1C and 1D with the low-k ILD layer 170.

Figure 11:
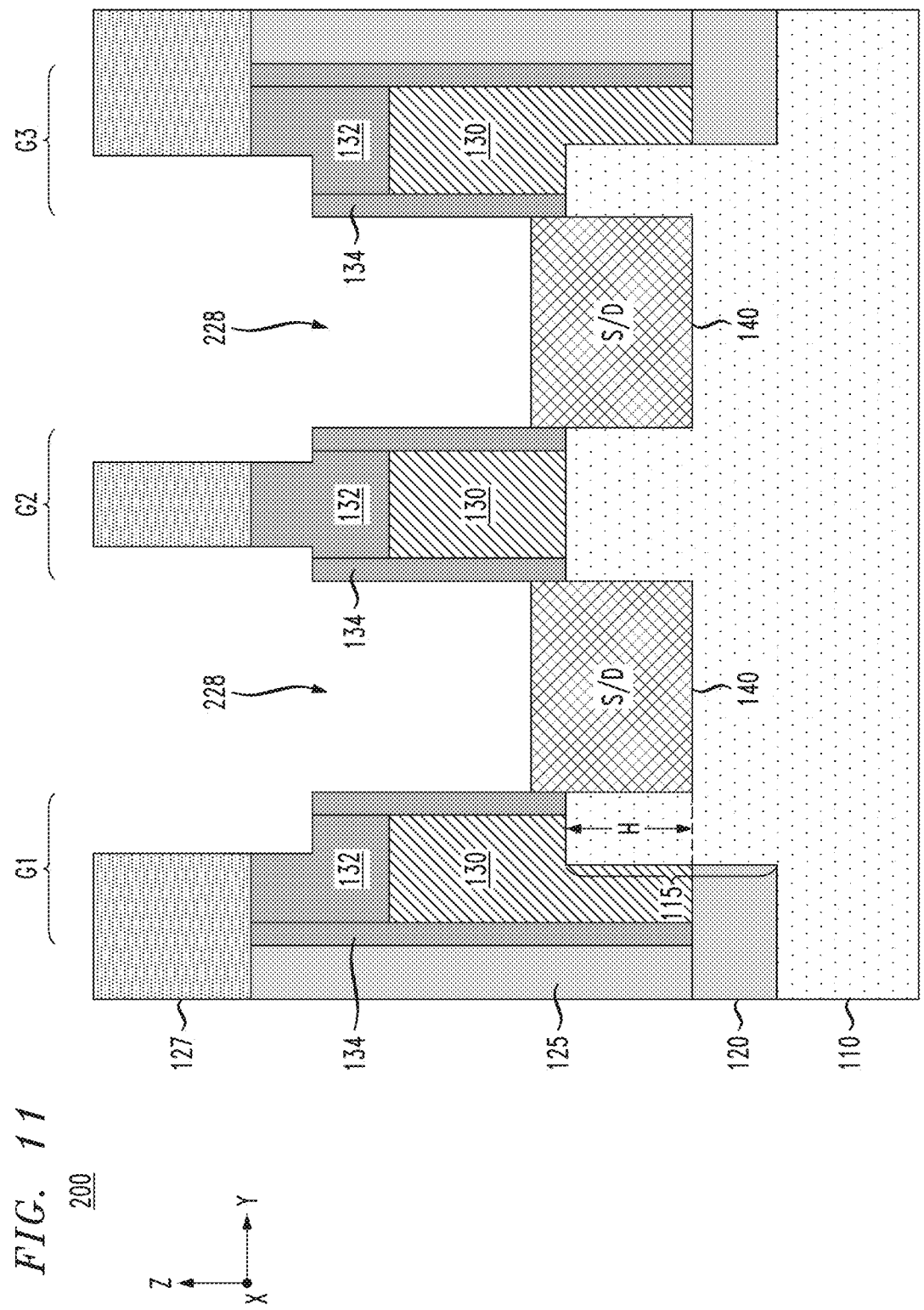
Figure 12:
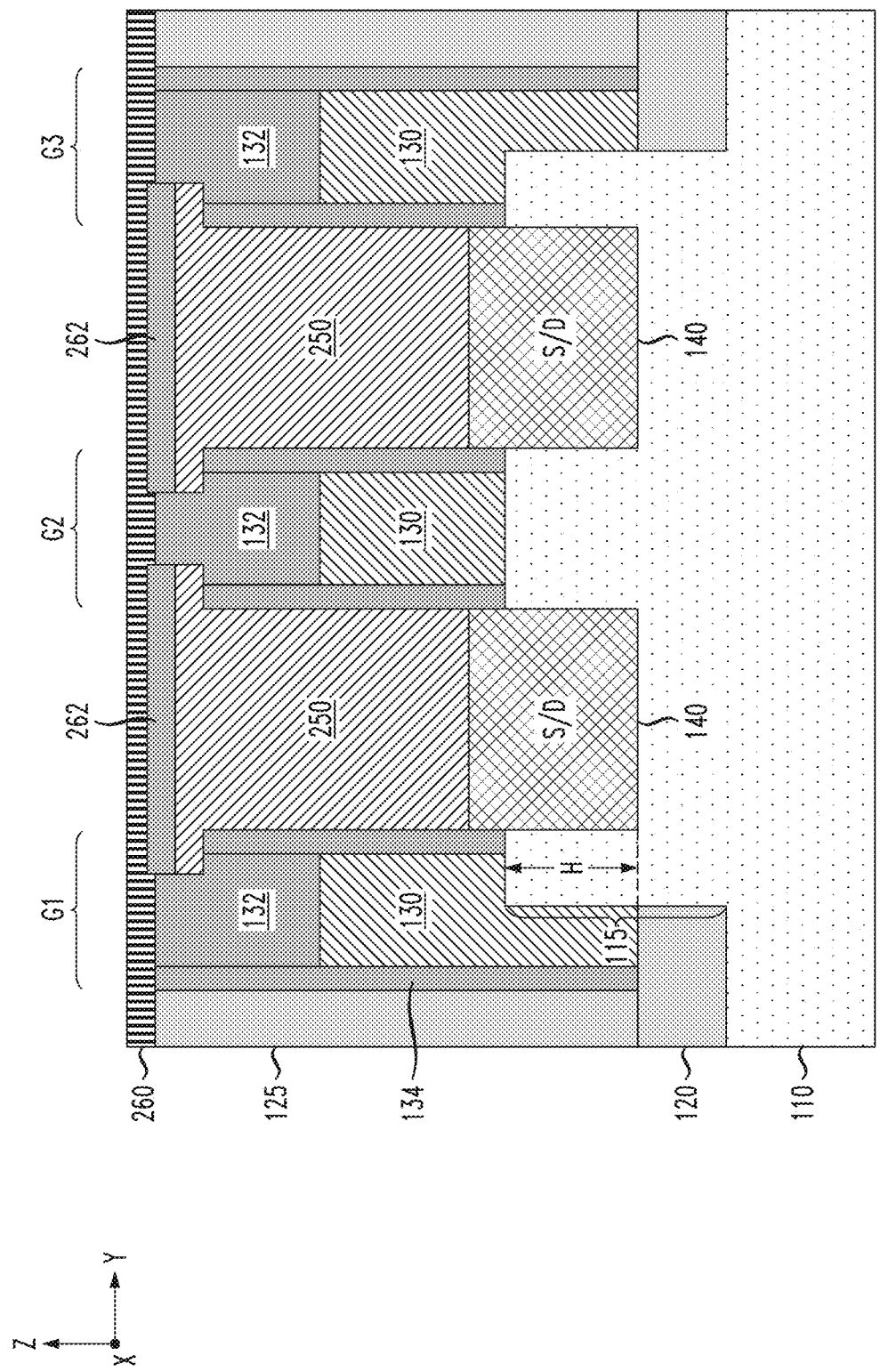
Figure 13:
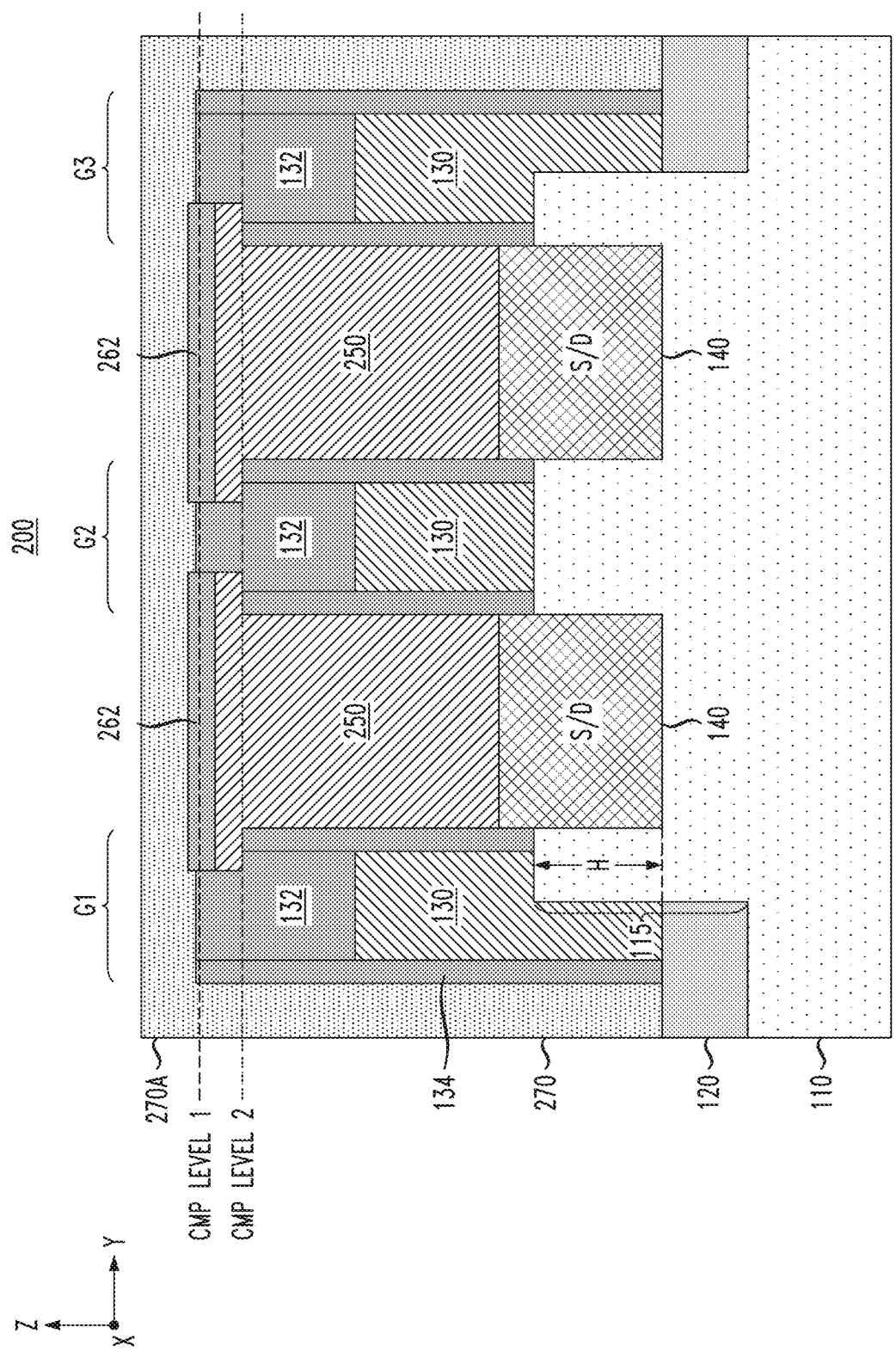

FIGS. 11 through 13 schematically illustrate a process for fabricating a semiconductor IC device 200 in which an interlayer dielectric layer replacement process is implemented to replace an initial sacrificial ILD with a low-k ILD layer, according to another embodiment of the invention. The fabrication process schematically illustrated in FIGS. 11-13 provides an alternate embodiment for fabricating a semiconductor integrated circuit device with discrete source/drain contacts wherein a sacrificial ILD layer is replaced with the low-k ILD layer while protecting the discrete source/drain contacts with metal-semiconductor alloy capping layers.

To begin, FIG. 11 is a schematic cross-sectional side view of the semiconductor IC device 200 at an intermediate stage of fabrication wherein FinFET devices D1 and D2 with source/drain layers 140 and metal gate structures G1, G2, and G3 are formed on a semiconductor substrate 110 and encapsulated in a sacrificial ILD layer 125, and after forming an etch mask 227 and patterning the sacrificial ILD layer 125 using the etch mask 227 to form discrete source/drain contact openings 228 that expose the source/drain layers 140. The intermediate semiconductor IC device structure shown in FIG. 11 is fabricated using the same or similar fabrication techniques as discussed above in conjunction with FIGS. 2A through 3B.

However, in the exemplary embodiment of FIG. 11, no additional sacrificial ILD material is formed on the planarized surface of the initial sacrificial ILD layer 125 following the RMG process module. In addition, the etch mask 227 (e.g., patterned OPL) is formed with discrete openings aligned to individual source/drain layers 140 between the gate structures G1, G2, and G3, as compared to the embodiment shown in FIG. 3A where the etch mask 127 is patterned to form a merged contact opening that spans the functional gate structure G2 and the source/drain layers 140 on opposing sides of the gate structure G2.

Next, FIG. 12 is a schematic cross-sectional side view of the semiconductor IC device shown in FIG. 11 after stripping away a remaining portion of the etch mask 227, performing a source/drain contact metallization process to fill the source/drain contact openings 228 with metallization to form discrete metallic source/drain contacts 250, forming a semiconductor layer 260 over the sacrificial ILD layer 125 and the discrete metallic source/drain contacts 250, and after performing a thermal anneal process to induce a reaction between semiconductor material of the semiconductor layer 260 and metallic material in upper surface regions of the discrete metallic source/drain contacts 250 to form metal-semiconductor alloy capping layers 262. In some embodiments, the metallic source/drain contacts 250, the semiconductor layer 260, and the protective metal-semiconductor alloy capping layers 262 are formed of the same or similar materials and fabrication techniques as discussed above in conjunction with FIGS. 4A, 4B and 5, the details of which will not be repeated.

Next, FIG. 13 is a schematic cross-sectional side view of the semiconductor IC device of FIG. 12 after stripping away the unreacted portions of the semiconductor layer 260, removing the sacrificial ILD layer 125, and after depositing a layer of low-k dielectric material 270A to form a replacement low-k ILD layer. In some embodiments, the etch processes for removing the remaining unreacted materials of the semiconductor layer 260 and the sacrificial ILD layer 125 are the same or similar to the etch processes discussed above in conjunction with FIGS. 6A, 6B and 7. In addition, the low-k ILD material 270A is formed using the same or similar materials and deposition methods as discussed above in conjunction with FIG. 7 for forming the low-k ILD layer 170A, the details of which will not be repeated.

As compared to the exemplary CMP process that is performed in FIG. 7 to remove the metal-semiconductor alloy capping layer 162 and the upper portion of the merged contact metallization 150A to form the discrete source/drain contacts 150, in some embodiments, a CMP process is performed on the semiconductor IC device structure of FIG. 13 down to an upper surface of the metal-semiconductor alloy capping layers 262, as schematically shown in FIG. 13 by a dashed line labeled "CMP level 1." In this instance, since the source/drain contacts 250 are initially fabricated as discrete contacts (with no merged contact metallization) the CMP process can be performed to remove the overburden portion of the low-k dielectric layer 270A and form the final low-k ILD layer 270, without having to etch away the protective silicide capping layers 262. In this instance, MOL processing can continue to form MOL contacts and vertical vias (e.g., gate contacts, source/drain via contacts, etc.) wherein the silicide capping layers 262 can serve as landing surfaces on which MOL vias can be formed.

In other embodiments, a CMP process is performed on the semiconductor IC device structure of FIG. 13 down to target level indicated by a dashed line labeled "CMP level 2" to remove the protective silicide capping layers 262 in addition to the overburden portion of the low-k dielectric layer 270A and form the low-k ILD layer 270. In this instance, the protective silicide capping layers 262 can be removed via CMP to expose the underlying metallization of the discrete source/drain contacts 250 and allow MOL source/drain via contacts, etc. to be formed in direct contact with the metallization of the source/drain contacts 250 (without the intervening silicide capping layer 262).

Following the formation of the semiconductor structure shown in FIG. 13, any known sequence of processing steps can be performed to complete the fabrication of the semiconductor integrated circuit device, the details of which are not needed to understand embodiments of the invention. Briefly, MOL processing can continue to form MOL contacts and vertical vias followed by a BEOL process module to fabricate a BEOL interconnect structure which provides connections to/between the MOL contacts, and other active or passive devices that are formed as part of the FEOL layer.

It is to be understood that the methods discussed herein for fabricating FET devices and source/drain contacts encapsulated in low-k ILD layers can be readily incorporated within semiconductor processing flows, semiconductor IC devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention. Besides FinFET devices, it is to be understood that the exemplary ILD replacement methods discussed herein can be applied to other transistor architectures, including but not limited to, nanowire transistors, nanosheet transistors, planar transistors, vertical transistors, fully depleted silicon-on-insulator (FDSOI) transistors, and partially depleted silicon-on-insulator (PDSOI) transistors.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:

1. A method for fabricating a semiconductor IC device, comprising:
    forming a field-effect transistor device on a semiconductor substrate, wherein the field-effect transistor device comprises a gate structure and source/drain layers;
    forming a sacrificial interlayer dielectric layer to encapsulate the field-effect transistor device;
    performing a metallization process to form metallic source/drain contacts in the sacrificial interlayer dielectric layer in contact with source/drain layers of the field-effect transistor device;
    depositing a semiconductor layer on the sacrificial interlayer dielectric layer and the metallic source/drain contacts;
    performing a thermal anneal process to induce a reaction between the semiconductor layer and the metallic source-drain contacts to form metal-semiconductor alloy capping layers in upper surface regions of the metallic source/drain contacts;
    removing unreacted portions of the semiconductor layer remaining after the thermal anneal process;
    performing an etch process to remove the sacrificial interlayer dielectric layer, wherein the etch process is selective to the metal-semiconductor alloy capping layers such that the metal-semiconductor alloy capping layers protect the metallic source/drain contacts from etch damage during the etch process; and
    forming a low-k interlayer dielectric layer in place of the removed sacrificial interlayer dielectric layer.

2. The method of claim 1, wherein the semiconductor layer comprises amorphous silicon.

3. The method of claim 1, wherein the metallic source/drain contacts comprise one of cobalt and ruthenium.

4. The method of claim 1, wherein the metal-semiconductor alloy capping layers comprise a cobalt-silicon alloy.

5. The method of claim 1, wherein the low-k interlayer dielectric layer comprises dielectric material having a dielectric constant k of about 3.0 or less.

6. The method of claim 1, wherein the sacrificial interlayer dielectric layer comprises silicon oxide.

7. The method of claim 1, wherein the sacrificial interlayer dielectric layer comprises a first sacrificial interlayer dielectric layer having an upper surface coplanar with an upper surface of the gate structure of the field-effect transistor device, and a second sacrificial interlayer dielectric layer formed on a planarized surface of the first sacrificial interlayer dielectric layer, and where performing the metallization process comprises:
    patterning the first and second sacrificial interlayer dielectric layer to form a merged source/drain contact trench that exposes the gate structure and the source/drain layers of the field-effect transistor device; and
    filling the merged source/drain contact trench with metallic material to form a merged metallic source/drain contact;
    wherein the semiconductor layer is deposited on the second sacrificial interlayer dielectric layer and the merged metallic source/drain contact.

8. The method of claim 7, wherein forming the low-k interlayer dielectric layer in place of the removed sacrificial interlayer dielectric layer comprises:
    depositing a layer of low-k dielectric material to re-fill spaces in which the material of the first sacrificial interlayer dielectric layer was removed and to cover the metal-semiconductor alloy capping layers; and
    performing a chemical-mechanical planarizing process to (i) remove overburden portions of the layer of low-k dielectric material, (ii) remove the metal-semiconductor alloy capping layers, and to (iii) remove a portion of the merged metallic source/drain contact above the gate structure to form discrete metallic source drain contacts.

9. The method of claim 1, wherein performing the metallization process comprises:
    patterning the sacrificial interlayer dielectric layer to form discrete contact trenches on opposite sides of the gate structure to expose the source/drain layers of the field-effect transistor device; and
    filling the discrete source/drain contact trenches with metallic material to form discrete metallic source/drain contacts.

10. The method of claim 9, wherein forming the low-k interlayer dielectric layer in place of the removed sacrificial interlayer dielectric layer comprises:
    depositing a layer of low-k dielectric material to re-fill spaces in which the material of the sacrificial interlayer dielectric layer was removed and to cover the metal-semiconductor alloy capping layers; and
    performing a chemical-mechanical planarizing process to remove overburden portions of the layer of low-k dielectric material and expose the metal-semiconductor alloy capping layers.

11. The method of claim 10, further comprising forming metallic vias in contact with the metal-semiconductor alloy capping layers of metallic source/drain contacts.

12. The method of claim 9, wherein forming the low-k interlayer dielectric layer in place of the removed sacrificial interlayer dielectric layer comprises:
    depositing a layer of low-k dielectric material to re-fill spaces in which the material of the sacrificial interlayer dielectric layer was removed and to cover the metal-semiconductor alloy capping layers; and
    performing a chemical-mechanical planarizing process to (i) remove overburden portions of the layer of low-k dielectric material and to (ii) remove the metal-semiconductor alloy capping layers and expose the metallic source/drain contacts.

* * * * *